US012610525B2

(12) United States Patent
Shao et al.

(10) Patent No.: US 12,610,525 B2
(45) Date of Patent: Apr. 21, 2026

(54) SEMICONDUCTOR STRUCTURE, METHOD FOR MANUFACTURING SEMICONDUCTOR STRUCTURE, MEMORY AND METHOD FOR MANUFACTURING MEMORY

(71) Applicant: CHANGXIN MEMORY TECHNOLOGIES, INC., Hefei City (CN)

(72) Inventors: Guangsu Shao, Hefei (CN); Yunsong Qiu, Hefei (CN); Deyuan Xiao, Hefei (CN); Xingsong Su, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 983 days.

(21) Appl. No.: 17/806,609

(22) Filed: Jun. 13, 2022

(65) Prior Publication Data

US 2023/0292486 A1     Sep. 14, 2023

Related U.S. Application Data

(63) Continuation of application No. PCT/CN2022/082188, filed on Mar. 22, 2022.

(30) Foreign Application Priority Data

Mar. 8, 2022    (CN) .......................... 202210220471.8

(51) Int. Cl.
H10B 12/00 (2023.01)
(52) U.S. Cl.
CPC ........... H10B 12/312 (2023.02); H10B 12/05 (2023.02); H10B 12/377 (2023.02)

(58) Field of Classification Search
CPC ..... H10B 12/312; H10B 12/05; H10B 12/377
See application file for complete search history.

(56) References Cited

U.S. PATENT DOCUMENTS

| | | |
|---|---|---|
| 9,698,272 B1 | 7/2017 | Ikeda |
| 10,790,396 B2 | 9/2020 | Sawabe |
| 10,818,799 B2 | 10/2020 | Pillarisetty |
| 11,024,719 B2 | 6/2021 | Sawabe |
| 2019/0295626 A1 | 9/2019 | Ikeda et al. |

(Continued)

FOREIGN PATENT DOCUMENTS

| | | |
|---|---|---|
| CN | 111710724 A | 9/2020 |
| CN | 113410304 A | 9/2021 |
| WO | 2018118097 A1 | 6/2018 |

OTHER PUBLICATIONS

Wenxing Huo,et,al. "Effects of active layer thickness on performance and stability of dual-active-layer amorphous InGaZnO thin-film transistors", Chin. Phys. B vol. 28, No. 8 (2019) 087302.

*Primary Examiner* — Trang Q Tran
(74) *Attorney, Agent, or Firm* — Syncoda LLC; Feng Ma

(57) ABSTRACT

A semiconductor structure includes at least one transistor. The transistor includes a channel, a gate, a source, and a drain. The channel includes a first material layer and a second material layer arranged around the first material layer. Resistivity of the first material layer is greater than a first preset value, and resistivity of the second material layer is less than a second preset value, the first preset value being greater than the second preset value. The gate covers at least one side of the channel. The source and the drain are at two ends of an extension direction of the channel.

11 Claims, 23 Drawing Sheets

(56) References Cited

U.S. PATENT DOCUMENTS

| | | |
|---|---|---|
| 2019/0296155 A1 | 9/2019 | Sawabe et al. |
| 2020/0058798 A1 | 2/2020 | Pillarisetty et al. |
| 2020/0303554 A1 | 9/2020 | Sawabe et al. |
| 2021/0288171 A1 | 9/2021 | Lee et al. |

20

Z

X

Y

201

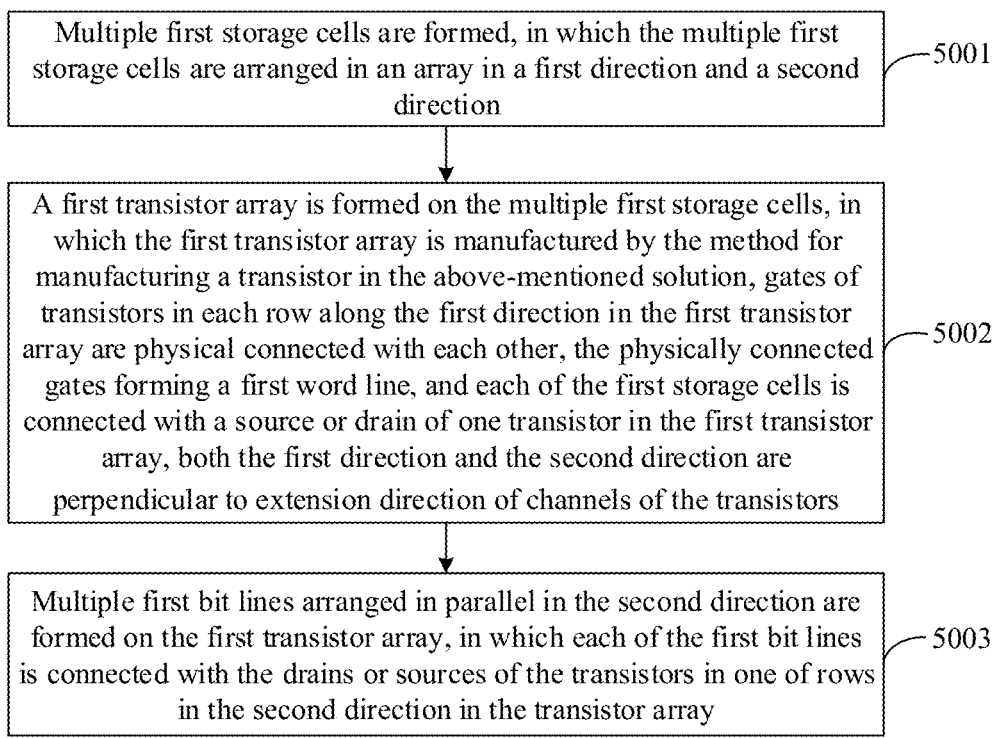

Multiple first storage cells are formed, in which the multiple first storage cells are arranged in an array in a first direction and a second direction ⌐5001

A first transistor array is formed on the multiple first storage cells, in which the first transistor array is manufactured by the method for manufacturing a transistor in the above-mentioned solution, gates of transistors in each row along the first direction in the first transistor array are physical connected with each other, the physically connected gates forming a first word line, and each of the first storage cells is connected with a source or drain of one transistor in the first transistor array, both the first direction and the second direction are perpendicular to extension direction of channels of the transistors ⌐5002

Multiple first bit lines arranged in parallel in the second direction are formed on the first transistor array, in which each of the first bit lines is connected with the drains or sources of the transistors in one of rows in the second direction in the transistor array ⌐5003

FIG. 5

SEMICONDUCTOR STRUCTURE, METHOD FOR MANUFACTURING SEMICONDUCTOR STRUCTURE, MEMORY AND METHOD FOR MANUFACTURING MEMORY

CROSS-REFERENCE TO RELATED APPLICATIONS

This application is a continuation of International Application No. PCT/CN2022/082188, filed on Mar. 22, 2022, which claims priority to Chinese Patent Application No. 202210220471.8, filed on Mar. 8, 2022. The disclosures of these applications are hereby incorporated by reference in their entirety.

BACKGROUND

With the constant reduction of sizes of semiconductor devices such as memories, sizes of transistors in semiconductor devices have also been reduced constantly, and size reduction has brought greater challenges to the performance of transistors. In a related art, a transistor is limited in size, and thus it is hard to achieve high performance.

SUMMARY

The disclosure relates to the technical field of semiconductors, and relates, but not limited, to a semiconductor structure and a method for manufacturing a semiconductor structure, and a memory and a method for manufacturing a memory.

Embodiments of the disclosure disclose a semiconductor structure and a method for manufacturing a semiconductor structure, and a memory and a method for manufacturing a memory.

The embodiments of the disclosure provide a semiconductor structure, which may include at least one transistor. The transistor includes a channel, a gate, a source, and a drain.

The channel includes a first material layer and a second material layer surrounding the first material layer. A resistivity of the first material layer is greater than a first preset value. A resistivity of the second material layer is less than a second preset value. The first preset value is greater than the second preset value.

The gate covers at least one side surface of the channel.

The source and the drain are respectively located at two ends of an extension direction of the channel.

The embodiments of the disclosure provide a method for manufacturing a transistor. The semiconductor structure includes at least one transistor. The method comprises a method for manufacturing the transistor. The method for manufacturing the transistor includes the following operations.

A channel is formed, in which the channel includes a first material layer and a second material layer surrounding the first material layer, a resistivity of the first material layer is greater than a first preset value, a resistivity of the second material layer is less than a second preset value, and the first preset value is greater than the second preset value.

A gate of the transistor covering at least one side surface of the channel is formed.

A source and a drain of the transistor are formed at two ends of an extension direction of the channel, respectively.

The embodiments of the disclosure also provide a memory, which includes a plurality of first storage cells, a first transistor array, and a plurality of first bit lines.

The plurality of first storage cells are arranged in an array in a first direction and a second direction.

The first transistor array is located on the plurality of first storage cells. The first transistor array includes a plurality of the transistors as described in the above-mentioned solution. The gates of the transistors in each row along the first direction in first transistor array are physically connected with each other, the physically connected gates forming a first word line. Each of the storage cells is connected with a source or a drain of one transistor in the transistor array. Both the first direction and the second direction are perpendicular to the extension direction of the channels of the transistors.

The plurality of first bit lines are be arranged in parallel in the second direction and located on the first transistor array. Each of the first bit lines is connected with drains or sources of the transistors in one of rows along the second direction in the first transistor array.

The embodiments of the disclosure also provide a method for manufacturing a memory, which includes the following operations.

A plurality of first storage cells are formed, the plurality of first storage cells are arranged in an array in a first direction and a second direction.

A first transistor array is formed on the plurality of first storage cells, the first transistor array is manufactured by the method for manufacturing a transistor in the above-mentioned solution, where the gates of the transistors in each row along the first direction are physically connected with each other, the physically connected gates forming a first word line, and each of the first storage cells is connected with a source or a drain of one transistor in the first transistor array, both the first direction and the second direction being perpendicular to extension directions of channels of the transistors.

A plurality of first bit lines arranged in parallel in the second direction are formed on the first transistor array, each of the first bit lines is connected with drains or sources of the transistors in one of rows along the second direction in the transistor array.

BRIEF DESCRIPTION OF THE DRAWINGS

FIG. 5 is an implementation flowchart of a method for manufacturing a semiconductor structure according to some embodiments of the disclosure.

DETAILED DESCRIPTION

Figure 1A:
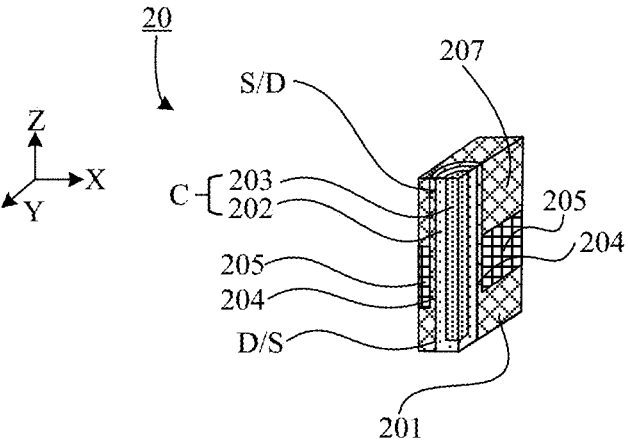
FIG. 1A is a Three-Dimensional (3D) structure diagram of a semiconductor structure according to some embodiments of the disclosure.

Exemplary implementation modes disclosed in the disclosure will now be described with reference to the drawings in more detail. Although the exemplary implementation modes of the disclosure are shown in the drawings, it is to be understood that the disclosure may be implemented in various forms and should not be limited to specific implementation modes described herein. Instead, these implementation modes are provided to make the disclosure understood more thoroughly and deliver the scope disclosed in the disclosure to those skilled in the art completely.

A plenty of specific details are presented in the following description so as to provide a more thorough understanding of the disclosure. However, it is apparent to those skilled in the art that the disclosure may be implemented without one or more of these details. In other examples, some known technical features in this art are not described, so as to avoid mixes with the disclosure. That is, here, not all features of practical embodiments are described, and known functions and structures are not described in detail.

In the drawings, sizes of a layer, a region, and an element as well as relative sizes thereof may be exaggerated for clarity. The same reference signs represent the same elements throughout the drawings.

It is to be understood that spatially relational terms such as "below", "under", "lower", "beneath", "above", and "upper" may be used herein for ease of description to describe a relationship between one element or feature and another element or feature illustrated in the figures. It is to be understood that, in addition to the orientation shown in the figures, the spatially relational terms are intended to further include different orientations of devices in use and operation. For example, if the devices in the figures are turned over, elements or features described as being "under" or "beneath" or "below" other elements or features will be oriented to be "on" the other elements or features. Therefore, the exemplary terms "under" and "below" may include both upper and lower orientations. The device may be otherwise oriented (rotated by 90 degrees or in other orientations), and the spatial descriptors used herein may be interpreted accordingly.

The terms used herein are for the purpose of describing specific embodiments only and not intended to limit the disclosure. As used herein, singular forms "a/an", "one", and "the" are also intended to include plural forms, unless otherwise specified in the context. It is also to be understood that, when terms "comprising" and/or "including" are used in this specification, the existence of the features, integers, steps, operations, elements, and/or components is determined, but the existence or addition of one or more other features, integers, steps, operations, elements, components, and/or groups is also possible. As used herein, term "and/or" includes any and all combinations of related listed items.

In order to make the features and technical contents of the embodiments of the disclosure understood in more detail, the implementation of the embodiments of the disclosure will be described below in combination with the drawings in detail. The drawings are appended only for description as references and not intended to limit the embodiments of the disclosure.

Transistors may be used for various memories, such as a dynamic random access memory (DRAM). Generally, the DRAM is of an architecture including one transistor T and one capacitance C (1T1C).

With the size reduction of memories, sizes of transistors in storage regions have also been reduced constantly. Due to the constant size reduction of transistors, it is hard to achieve high performance of transistors in the related art under the limit of channel sizes of the transistors. Specifically, some transistors, such as thin-film transistors (TFTs), are high in field-effect mobility (gE) but low in threshold voltage (Vth). Alternatively, some other transistors are high in Vth but low in $\mu FE$. In the related art, it is impossible to achieve both high gE and high Vth of a transistor, and thus it is hard to meet a requirement for high performance. In order to solve at least one of the foregoing problems, the embodiments of the disclosure provide a semiconductor structure as well as a method for manufacturing the same, and a memory as well as a method for manufacturing the same.

An embodiment of the disclosure provides a semiconductor structure. FIG. 1A is a 3D structure diagram of a semiconductor structure according to an embodiment of the disclosure (which may be understood as a 3D schematic sectional view of a transistor in the semiconductor structure along an X-Z plane and a Y-Z plane respectively). The semiconductor structure includes at least one transistor. The transistor 20 includes a channel C, a gate 205, a source S, and a drain D.

The channel C includes a first material layer 203 and a second material layer 202 surrounding the first material layer 203. A resistivity of the first material layer 203 is greater than a first preset value. A Resistivity of the second material layer 202 is less than a second preset value. The first preset value is greater than the second preset value.

The gate 205 covers at least one side surface of the channel.

The source S and the drain D are respectively located at two ends of an extension direction of the channel C.

It is to be noted that the transistor provided in the embodiment of the disclosure may be a vertical transistor, a transistor of which a gate is a buried gate. FIG. 1a illustrates not only each component of the transistor but also a dielectric layer (a first dielectric layer 201 and second dielectric layer 207 as described below) needed by the buried gate 205.

Here, the first material layer 203 and second material layer 202 in the channel C focus on different aspects of performance improvement of the transistor. The first material layer 203 of which the resistivity is greater than the first preset value is arranged at a side, away from the gate 205, of an inner side (understood as pointing to a core of the channel in a radial direction of the channel in an X-Y plane) of the channel C, and is mainly configured to increase a threshold voltage Vth of the transistor. The second material layer 202 of which the resistivity is less than the second preset value is arranged at a side, close to the gate 205, of an outer side (understood as being away from the core of the channel in the radial direction of the channel in the X-Y plane) of the channel C, and is mainly configured to improve the field-effect mobility gE of the transistor.

It can be understood that, in the embodiment of the disclosure, the channel C including the first material layer 203 and second material layer 202 with different resistivity can achieve high gE and high Vth of the transistor as required. When the continuously smooth second material layer 202 with low resistivity is formed at an outer side of the first material layer 203 with high resistivity, an ON/OFF ratio, Vth, and μFE are improved significantly due to defect passivation and a high-quality homojunction interface. The second material layer 202 not only affects a value of Vth but also affects gE greatly.

Here, the first preset value is a relatively high resistivity value, and the second preset value is a relatively low resistivity value. In practical applications, the first preset value and the second preset value may be adjusted according to an actual situation. In some embodiments, the first preset value may be 100 MΩ·cm, and the second preset value may be 0.1 MΩ·cm. That is, the resistivity of the first material layer 203 is greater than 100 MΩ·cm, and the resistivity of the second material layer 202 is less than 0.1 MΩ·cm.

In practical applications, a first material layer 203 and second material layer 202 with desired resistivity may be selected by material selection, doping concentration (P-type/N-type carrier) selection, and manufacturing process parameter (oxidizing atmosphere/reducing atmosphere) selection.

Exemplarily, if a selected material itself has a high resistivity, it is relatively suitable for forming the first material layer 203, and if a selected material itself has a low resistivity, it is relatively suitable for forming the second material layer 202.

Exemplarily, a material layer with high resistivity is formed easily in case of a relatively low carrier doping concentration, and a material layer with low resistivity is formed easily in case of a relatively high carrier doping concentration. Therefore, a relatively low carrier doping concentration may be provided during the formation of the first material layer 203 with high resistivity, and a relatively high carrier doping concentration may be provided during the formation of the second material layer 202 with low resistivity.

Exemplarily, a material layer with high resistivity is formed easily in an oxidizing atmosphere (oxygen-containing atmosphere), and a material layer with low resistivity is formed easily in a reducing atmosphere (oxygen-free atmosphere). Therefore, the formation of the first material layer 203 with high resistivity may be performed in the oxidizing atmosphere, and the formation of the second material layer 202 with low resistivity may be performed in the oxygen-free atmosphere.

In practical applications, a thickness of the first material layer 203 is relatively large, and a thickness of the second material layer 203 is relatively small. In some embodiments, the thickness of the first material layer 203 in a radial direction of a channel hole is 1-10 times of that of the second material layer 202 in the radial direction of the channel hole. Considering that the influence is weakened after the thickness of the second material layer with low resistivity is increased to exceed about 10 nm, in some embodiments, the thickness of the second material layer in the radial direction of the channel hole ranges from 1 nm to 10 nm, and the thickness of the first material layer in the radial direction of the channel hole ranges from 10 nm to 100 nm.

In some embodiments, a material of the first material layer 203 may be the same as or different from that of the second material layer 202.

In some embodiments, the material of the first material layer and/or the material of the second material layer include an amorphous semiconductor material. It is to be noted that the amorphous semiconductor material has higher μFE than a crystalline (such as monocrystalline or polycrystalline) semiconductor material. In some embodiments, the material of the first material layer 203 and/or the material of the second material layer 202 include at least one of indium oxide, gallium oxide, zinc oxide, indium gallium oxide, indium zinc oxide, gallium zinc oxide, or indium gallium zinc oxide. Alternatively, the material of the first material layer 203 and/or the material of the second material layer 202 includes a mixture formed by doping at least one compound of indium oxide, gallium oxide, zinc oxide, indium gallium oxide, indium zinc oxide, gallium zinc oxide, or indium gallium zinc oxide with at least one element of cobalt, nickel, tin, aluminum, magnesium, zirconium, hafnium, titanium, tantalum, or tungsten.

In a specific example, the materials of the first material layer 203 and the second material layer 202 may both be indium gallium zinc oxide (IGZO).

It can be understood that IGZO may drive a heavy current. Therefore, when an IGZO transistor is used in a memory, the writing speed of the memory is faster, and when the IGZO transistor is turned off, few charges are leaked, which prolongs the service life of a bit.

In some embodiments, the gate 205 surrounds the channel C. That is, the vertical transistor in the embodiment of the disclosure may be a gate-all-around transistor. It is to be noted that the vertical transistor in the embodiment of the disclosure is not limited to a gate-all-around transistor, and may also include a vertical transistor of another type, such as a gate-half-round transistor and a cylindrical gate transistor. In practical applications, a gate oxide layer 204 is further formed between the gate 205 and the channel C, namely between the gate 205 and the second material layer 202.

In some embodiments, as shown in FIG. 1A, the source S and the drain D may be transposed. The source S is at a first end of the channel C, and the drain D is at a second end of the channel C. Alternatively, the drain D is at the first end of the channel C, and the source S is at the second end of the channel C. The first end and the second end are two opposite ends of the channel C in a third direction respectively. Here, the third direction is the extension direction of the channel C.

Figure 1B:
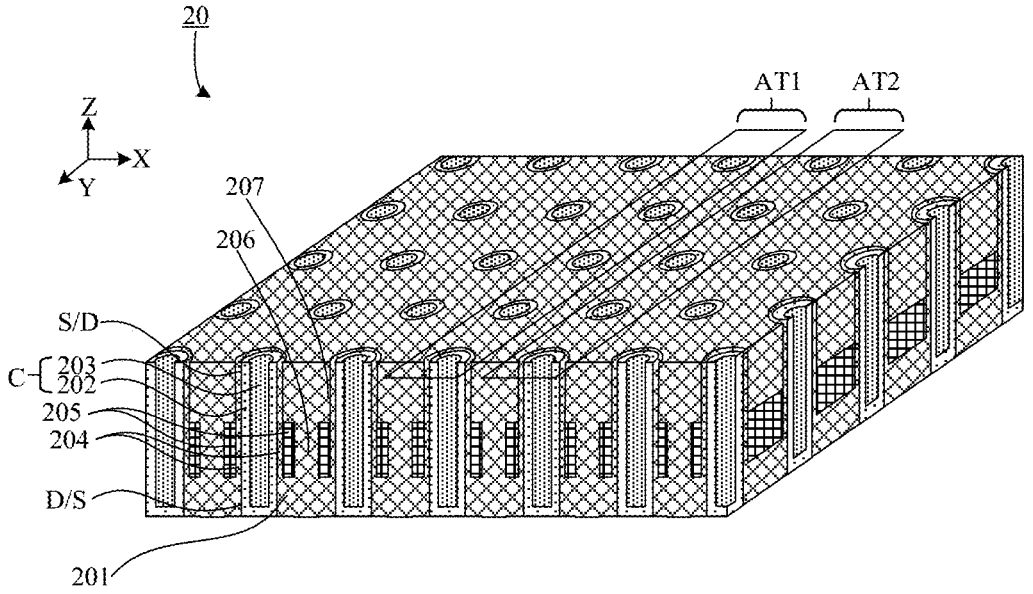
FIG. 1B is a 3D structure diagram of another semiconductor structure according to some embodiments of the disclosure.

Referring to FIG. 1B, in some embodiments, the semi-conductor structure includes multiple transistors. Multiple channels C corresponding to the multiple transistors are arranged in an array in a first direction X and a second direction Y. Both the first direction X and the second direction Y are perpendicular to extension directions of the channels C.

Gates of transistors in each row AT along the first direction are physically connected with each other. The gates of the transistors in each row AT1 along the first direction are electrically isolated from the gates of the transistors in an adjacent row AT2 along the first direction.

In practical applications, FIG. 1B also illustrates a dielectric layer (such as a first dielectric layer 201, gate isolation structure 206, and second dielectric layer 207 as described below) needed by the buried gate 205. It can be understood that the gates 205 of the transistors in each row AT along the first direction X are physically connected with each other, thereby forming a word line, the word line are formed into a buried word line. The gates 205 of the transistors in row AT1 along the first direction are electrically isolated from the gates of the transistors in an adjacent row AT2 along the first direction by the gate isolation structure 206. The gate 205 is isolated from the other components by the first dielectric layer 201 and the second dielectric layer 207 in the third direction Z.

In some embodiments, the first direction intersects the second direction, and an included angle between the first direction and the second direction may be any angle from 0 to 90 degrees. For example, the first direction may be perpendicular to the second direction. It can be understood that the included angle between the first direction and the second direction establishes a positional relationship for the array arrangement of the transistors in the first direction and the second direction.

The first direction and second direction in the embodiment of the disclosure are represented as two orthogonal directions parallel to a substrate plane herein and hereinafter for ease of description. The substrate plane may be understood as a plane perpendicular to the extension direction of the channel. The first direction is represented as the X direction in the drawing. The second direction is represented as the Y direction in the drawing. The third direction is represented as the Z direction in the drawing.

In some embodiments, a shape of a cross section of the channel C perpendicular to the third direction and passing through the channel C may be a round, a square, an ellipse, or a rhombus. In practical applications, the shape may be selected according to a specific process. For example, a round channel hole may be formed by etching by a patterning process, and the channel C is formed by deposition in the round channel hole. In such case, the shape of the cross section of the channel C perpendicular to the third direction and passing through the channel C is a round.

In each embodiment of the disclosure, the source and drain of the transistor are arranged in an extension direction of the transistor, so that an area occupied by a single transistor in a horizontal direction is reduced, and more transistors may be arranged in a unit area. Therefore, a requirement for small size of the transistor may be met. In addition, the channel structurally includes the first material layer and second material layer with different resistivities, where the second material layer with low resistivity is favorable for increasing a threshold voltage of the transistor, and the first material layer with high resistivity is favorable for improving the field-effect mobility of the transistor. In the embodiment of the disclosure, the channel including the first material layer and the second material layer enables the transistor to have both relatively high field-effect mobility and a relatively high threshold voltage, so that a requirement for high performance of the transistor may be met.

The transistor provided in the above-mentioned embodiment of the disclosure includes the channel including the first material layer and second material layer with different resistivities. Furthermore, parameters of the first material layer and/or the second material layer, such as resistivity values, thicknesses, and material compositions, may be selected properly to further improve the $\mu FE$ and Vth of the transistor, thereby obtaining a transistor with higher performance.

The semiconductor structure provided in the embodiment of the disclosure may be formed by a method for manufacturing a semiconductor structure in the following embodiment. A semiconductor structure manufactured by the method for manufacturing a semiconductor structure in the embodiment of the disclosure is similar to the semiconductor structure in the above-mentioned embodiment. Technical features that are not disclosed in detail in the embodiment of the disclosure are understood with reference to the above-mentioned embodiment, and will not be elaborated herein.

It can be understood that the method for manufacturing a semiconductor structure in the embodiment of the disclosure is not limited to manufacturing a specific number of transistors, and may be a method for manufacturing a single transistor, or a method for manufacturing a transistor array. The following descriptions and the drawings take the method for manufacturing a transistor array as an example. FIGS. 3A to 3J are 3D structure diagrams of a process for manufacturing a semiconductor structure according to an embodiment of the disclosure. It is to be understood that the operations shown in FIGS. 3A to 3J are nonexclusive, and other operations may also be performed before, after, or between any operations shown. A sequence of each operation shown in FIGS. 3A to 3J may be adjusted as practically required.

The method for manufacturing a semiconductor structure in the embodiment of the disclosure will be described below in detail in combination with FIG. 2 and FIGS. 3A to 3J.

Figure 2:
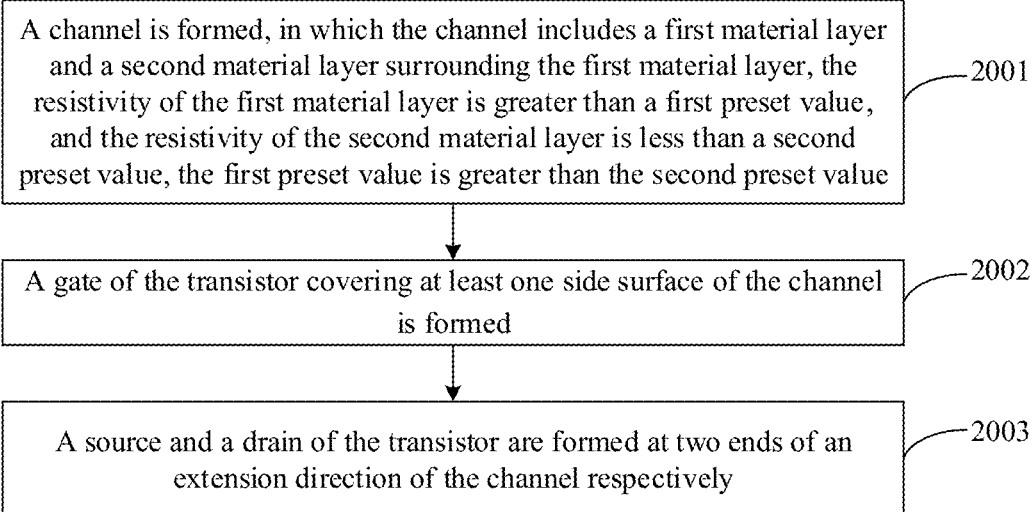
FIG. 2 is an implementation flowchart of a method for manufacturing a semiconductor structure according to some embodiments of the disclosure.

FIG. 2 is an implementation flowchart of a method for manufacturing a semiconductor structure according to an embodiment of the disclosure. FIGS. 3A to 3J are 3D structure diagrams of a process for manufacturing a semi-conductor structure according to an embodiment of the disclosure.

Referring to FIG. 2, in some embodiments, the semiconductor structure includes at least one transistor. The method for manufacturing a transistor includes the following operations.

In 2001, a channel is formed, in which the channel includes a first material layer and a second material layer surrounding the first material layer, the resistivity of the first material layer is greater than a first preset value, and the resistivity of the second material layer is less than a second preset value, the first preset value is greater than the second preset value.

In 2002, a gate of a transistor covering at least one side surface of the channel is formed.

In 2003, a source and drain of the transistor are formed at two ends of an extension direction of the channel respectively.

The operation 2001 is performed, as shown in FIGS. 3A to 3D, so as to form a channel C.

In some embodiments, forming a channel C includes the following operations.

A first dielectric layer 201 is provided.

A first hole CH is formed in the first dielectric layer 201.

The second material layer 202 is formed at a sidewall and bottom of the first hole CH.

The first hole with the second material layer 202 is filled to form the first material layer 203.

Figure 3A:
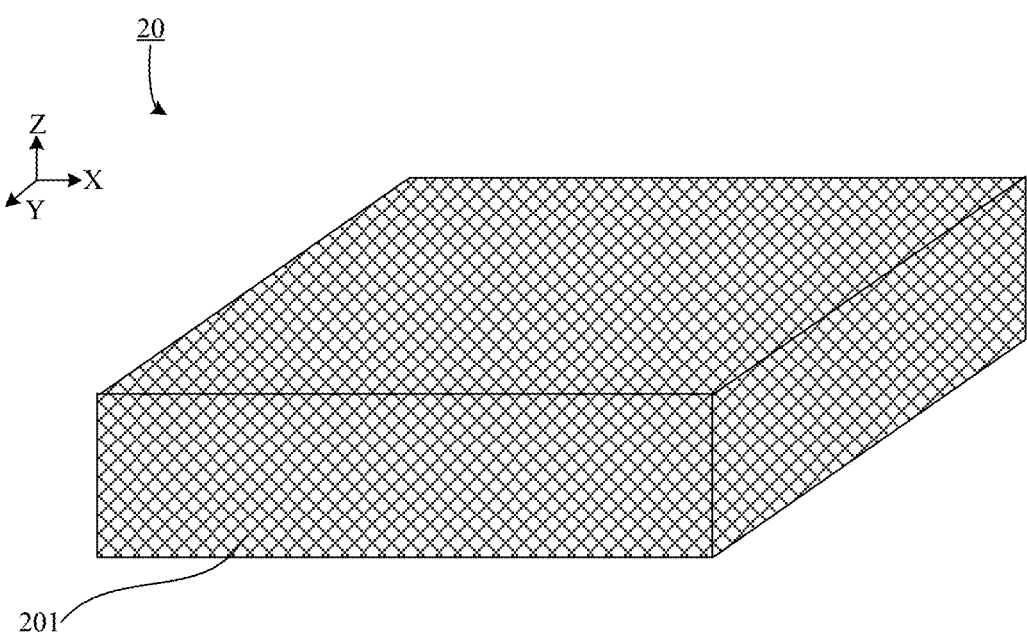
FIG. 3A is a first 3D structure diagram of a process for manufacturing a semiconductor structure according to some embodiments of the disclosure.

Referring to FIG. 3A, a first dielectric layer 201 is provided. A material of the first dielectric layer 201 may include, but not limited to, silicon oxide. In practical applications, the first dielectric layer 201 may be formed by a physical vapor deposition (PVD) process, a chemical vapor deposition (CVD) process, an ALD process, etc.

In some embodiments, the first dielectric layer 201 may be formed on a substrate as practically required by a device. A material of the substrate (not shown) may include silicon (Si), germanium (Ge), silicon germanide (SiGe), etc. Alternatively, the substrate (not shown) may be a silicon-on-insulator (all) or a germanium-on-insulator (GOI). The substrate is doped with a certain impurity ion as needed. The impurity ion may be an N-type impurity ion or a P-type impurity ion. In an embodiment, the doping includes well region doping and source/drain region doping, and an active layer (not shown) is formed in the substrate. In some other embodiments, the first dielectric layer 201 may be formed on, for example, another functional thin film layer rather than the substrate.

Figure 3B:
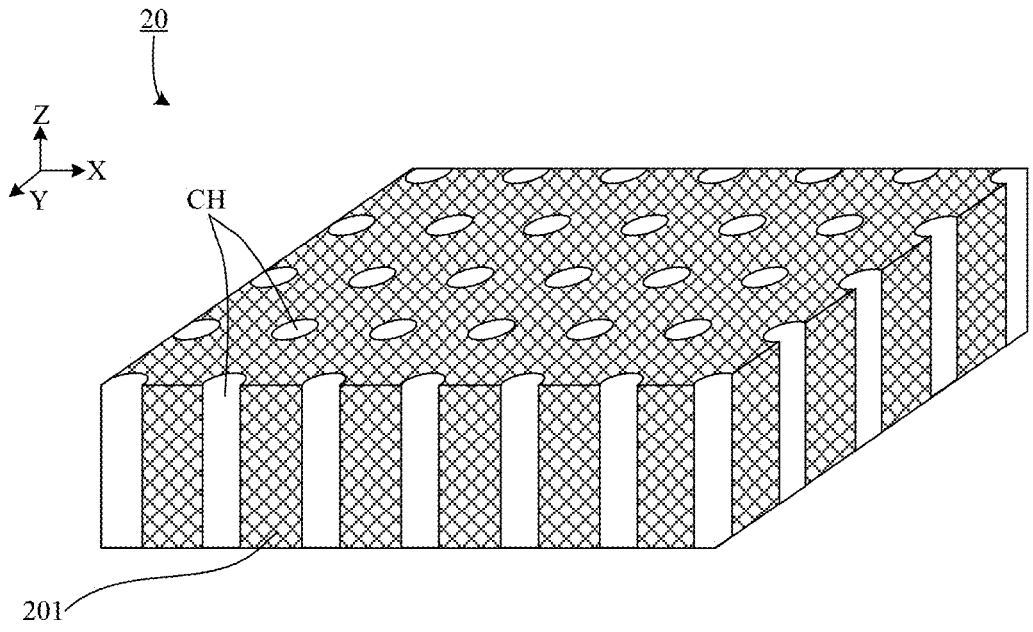
FIG. 3B is a second 3D structure diagram of a process for manufacturing a semiconductor structure according to some embodiments of the disclosure.

Referring to FIG. 3B, a first hole CH is formed in the first dielectric layer 201. The first hole CH penetrating through the first dielectric layer 201 may be formed by an etching process. In practical applications, the first hole CH may be formed in the first dielectric layer 201 by dry etching, such as ion beam milling etching, plasma etching, reactive ion etching, and laser ablation processes.

Figure 3C:
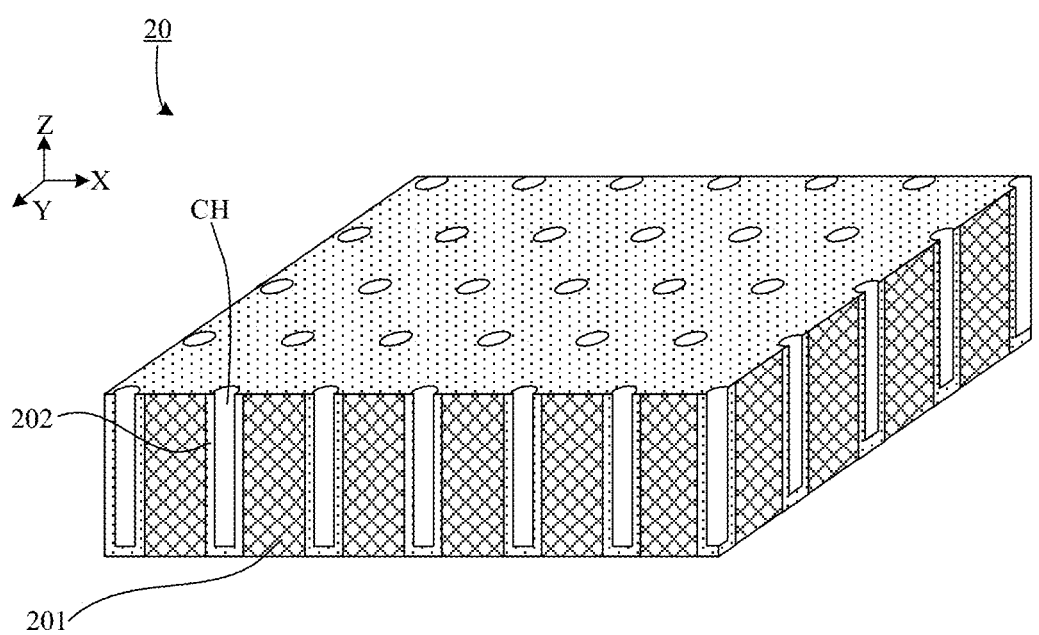
FIG. 3C is a third 3D structure diagram of a process for manufacturing a semiconductor structure according to some embodiments of the disclosure.
Figure 3D:
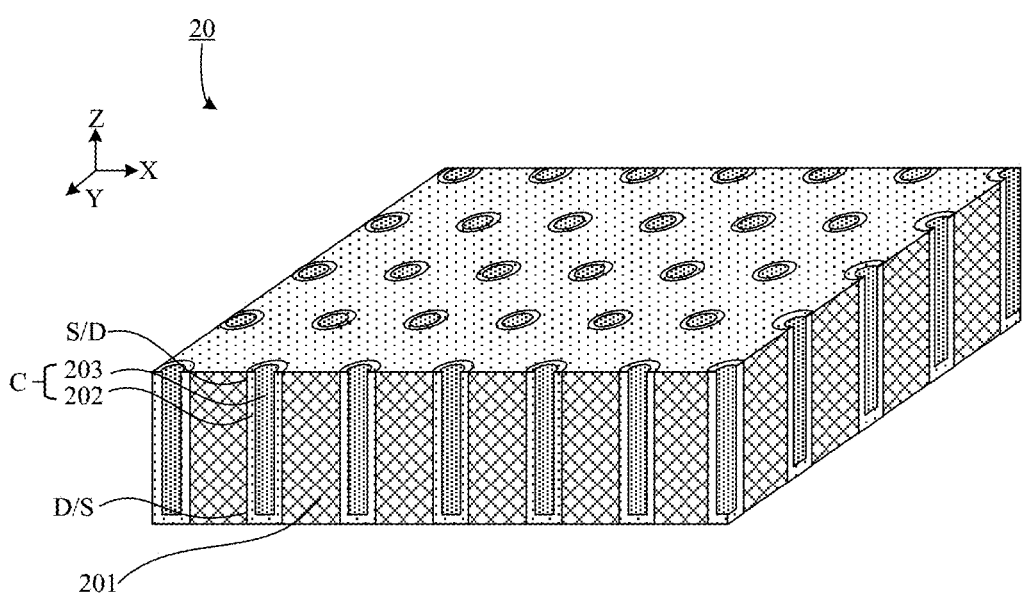
FIG. 3D is a fourth 3D structure diagram of a process for manufacturing a semiconductor structure according to some embodiments of the disclosure.

Referring to FIGS. 3C and 3D, the second material layer 202 is formed at a sidewall and bottom of the first hole CH. The first hole CH with the second material layer 202 is filled to form the first material layer 203. The second material layer 202 and the first material layer 203 may be formed by one or more deposition processes. The process includes, but not limited to, a PVD process, a CVD process, an ALD process, or any combination thereof. For example, the second material layer 202 and the first material layer 203 may be formed by the ALD process.

In some embodiments, forming the second material layer at a sidewall and bottom of the first hole includes that: the second material layer is formed in an oxygen-free atmosphere by an ALD process.

Filling the first hole with the second material layer to form the first material layer includes that: the first material layer is formed in an oxygen-containing atmosphere by in-situ deposition. In practical applications, a reactant gas containing a material of the second material layer 202 is introduced in an oxygen-free atmosphere to form the second material layer 202 at the sidewall and bottom of the first hole CH by an ALD process. Then, the introduction of the reactant gas containing the material of the second material layer 202 is stopped, and a reactant gas containing a material of the first material layer 203 is introduced, while a certain proportion of oxygen is introduced, thereby forming the first material layer 203 on the second material layer 202 in an oxygen-containing atmosphere by in-situ deposition. It can be understood that the resistivity of the first material layer 203 and the resistivity of the second material layer 202 change significantly under the influence of their surrounding atmospheres (such as an oxidizing gas or a reducing gas) during formation. On this account, the resistivity of the second material layer 202 formed in the oxygen-free atmosphere (in practical applications, the atmosphere is not oxygen-free absolutely, but an oxygen content of the atmosphere is maximally controlled within an acceptable range of the process) is relatively low. The resistivity of the first material layer 203 is adjusted by controlling the introduction of a certain proportion of oxygen. If more oxygen is introduced, the resistivity of the formed first material layer 203 is higher.

It is to be noted that technical features about the first material layer 203 and second material layer 202 that are not disclosed in detail in the embodiment of the disclosure, such as the selection of resistivity, thicknesses, material compositions and other parameters, are understood with reference to the above-mentioned embodiment, and will not be elaborated herein.

The operations 2002 and 2003 are performed, as shown in FIGS. 3E to 3J, so as to form a gate of the transistor covering at least one side surface of the channel and form a source and drain of the transistor at two ends of an extension direction of the channel respectively.

In some embodiments, after the first material layer 202 is formed, the method further includes the following operations.

The first dielectric layer 201 is etched partially to expose the second material layer 202.

A gate oxide layer 204 is formed on the exposed second material layer 202.

Filling is performed sequentially with a first conductive material and a second dielectric layer 207, the first conductive material and the second dielectric layer are etched to form a groove, and the groove is filled with an insulating material to form a gate isolation structure 206.

Figure 3E:
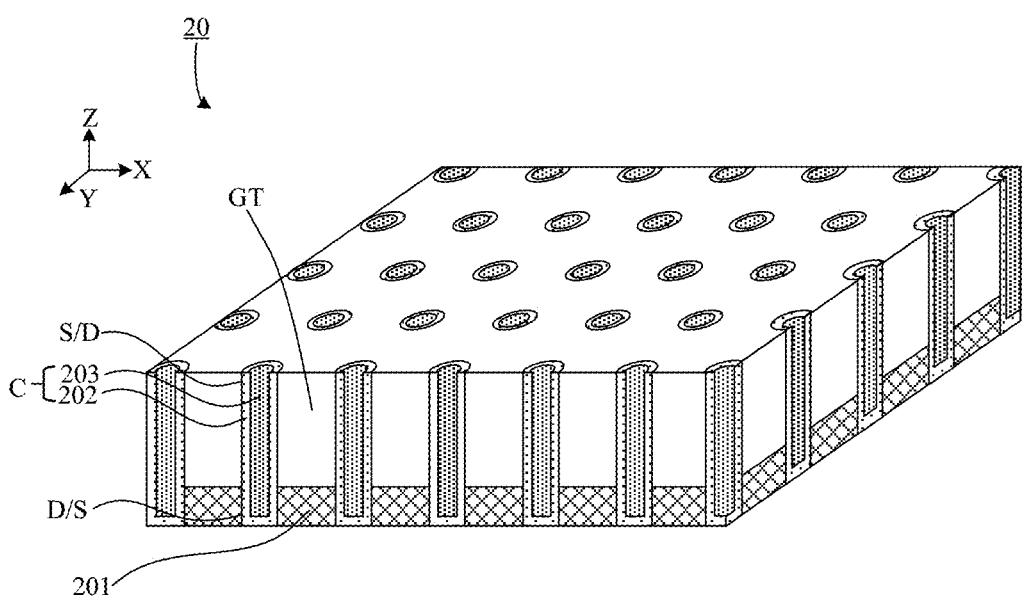
FIG. 3E is a fifth 3D structure diagram of a process for manufacturing a semiconductor structure according to some embodiments of the disclosure.

Referring to FIG. 3E, the first dielectric layer 201 is etched partially to expose the second material layer 202. A groove GT may be formed by an etching process to expose a sidewall of the second material layer 202. In practical applications, the groove GT exposing the sidewall of the second material layer 202 may be formed by dry etching, such as ion beam milling etching, plasma etching, reactive ion etching, and laser ablation processes.

In some embodiments, the groove GT does not penetrate through the first dielectric layer 201 in the third direction. In practical applications, a depth of the groove GT in the third direction may be less than a thickness of the channel C in the third direction.

Figure 3F:
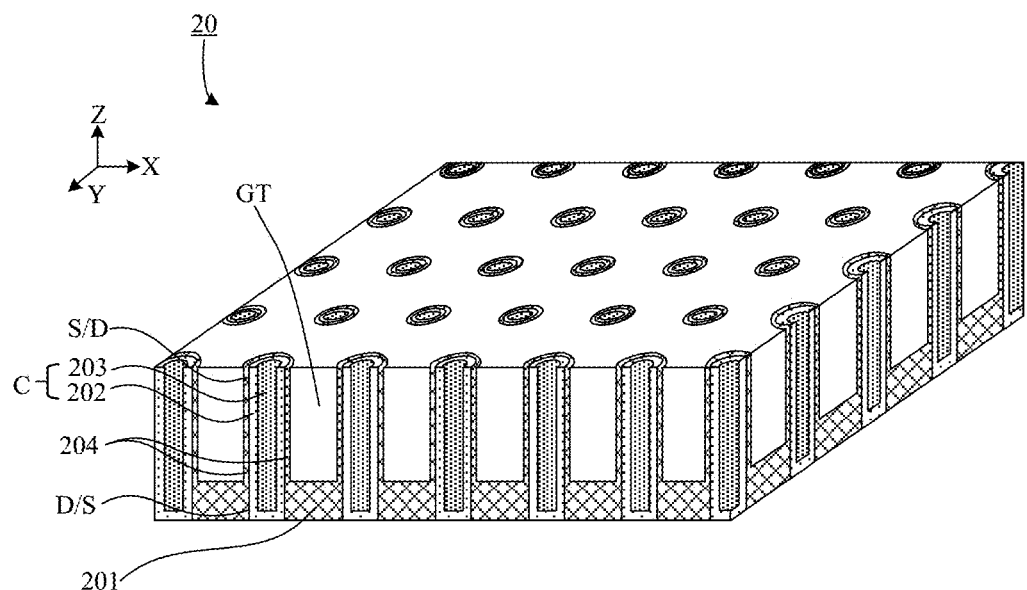
FIG. 3F is a sixth 3D structure diagram of a process for manufacturing a semiconductor structure according to some embodiments of the disclosure.

Referring to FIG. 3F, a gate oxide layer 204 is formed on the exposed second material layer 202. The gate oxide layer 204 may be formed at least at an exposed sidewall of each channel (i.e., exposed sidewall of the second material layer 202) by performing in-situ oxidation on the exposed sidewall of the second material layer 202 in the corresponding groove GT.

Here, in-situ oxidation may be performed on the exposed sidewall of each channel C (i.e., the exposed sidewall of the second material layer 202) by heating or pressurization, thereby forming the gate oxide layer silica.

In some embodiments, the gate oxide layer 204 surrounds the channel C. That is, the gate oxide layer 204 is formed around the second material layer 202.

Figure 3G:
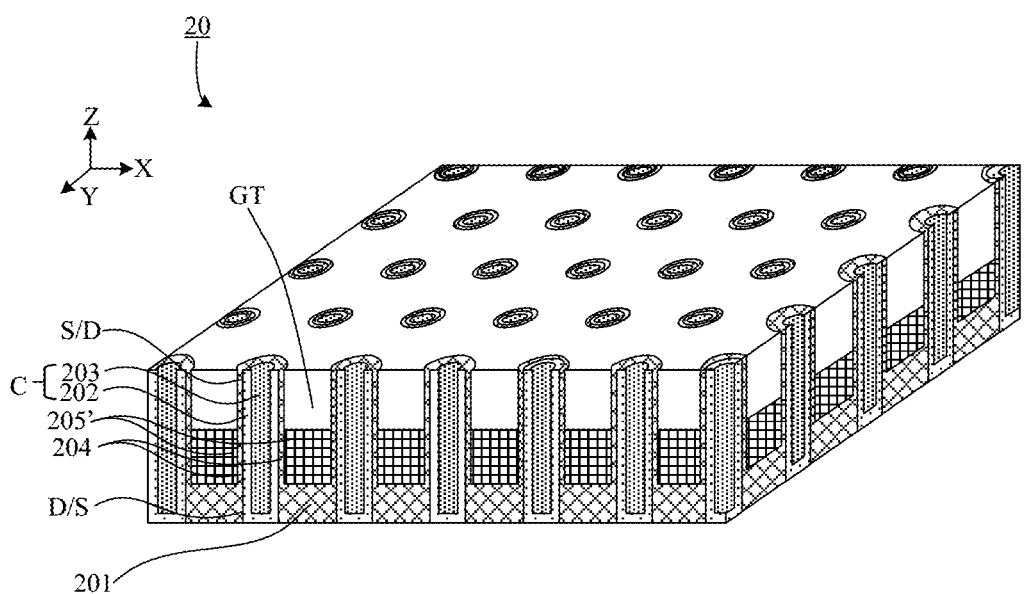
FIG. 3G is a seventh 3D structure diagram of a process for manufacturing a semiconductor structure according to some embodiments of the disclosure.
Figure 3H:
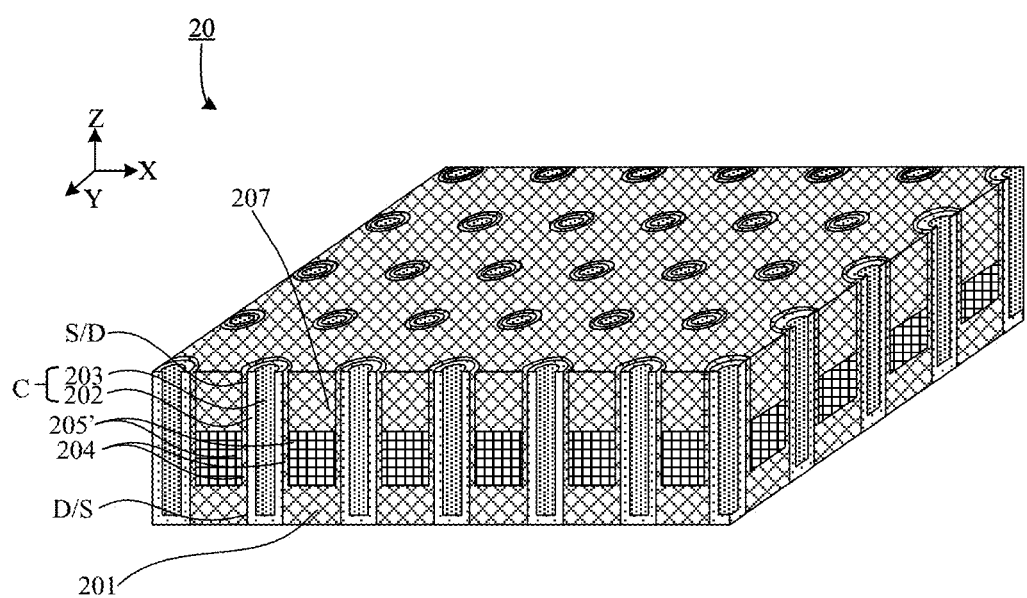
FIG. 3H is an eighth 3D structure diagram of a process for manufacturing a semiconductor structure according to some embodiments of the disclosure.

Referring to FIGS. 3G and 3H, filling is performed sequentially with a first conductive material 205' and a second dielectric layer 207. The first conductive material 205' may be deposited in the formed groove GT with the gate oxide layer 204 by a PVD process, a CVD process, an ALD process, or the like. Then, the second dielectric layer 207 is deposited in the formed groove GT with the gate oxide layer 204 and the first conductive material 205' by an etch-back process.

Here, the first conductive material 205' may be a metallic material or a semiconductor conductive material, such as copper, cobalt, tungsten, molybdenum, doped silicon, polycrystalline silicon, or any combination thereof. A material of the second dielectric layer 207 includes, but not limited to, silicon nitride, silicon oxynitride, silicon carbide, silica, or any combination thereof.

Figure 3I:
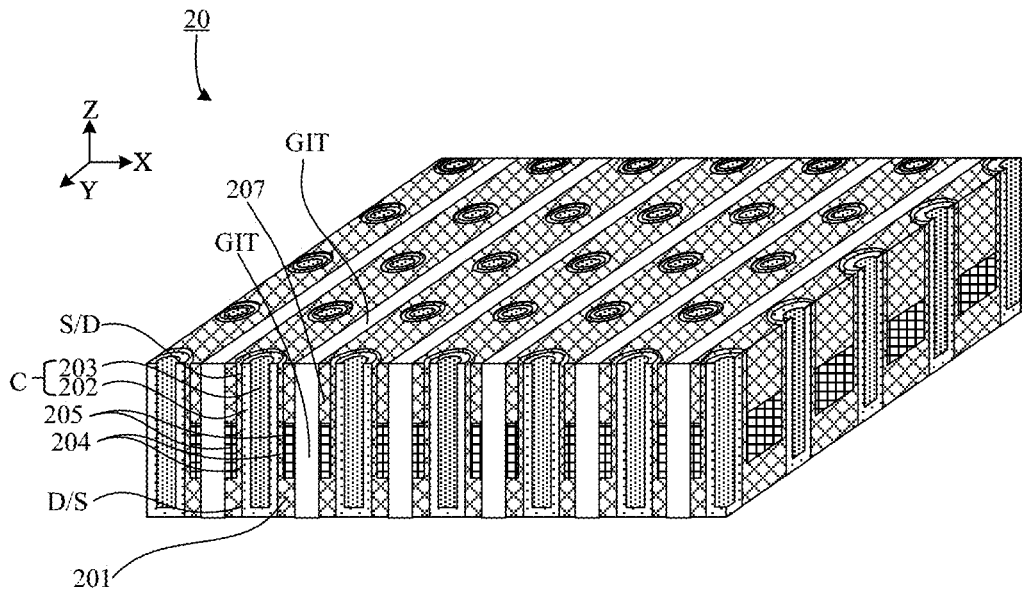
FIG. 3I is a ninth 3D structure diagram of a process for manufacturing a semiconductor structure according to some embodiments of the disclosure.

Referring to FIG. 3I, the first conductive material 205' and the second dielectric layer 207 are etched to form a groove GIT. The groove GTI may be formed by an etching process. The groove GTI penetrates through the first conductive material 205' in the third direction. In practical applications, the groove GIT penetrating through the first conductive material 205' in the third direction may be formed by dry etching, such as ion beam milling etching, plasma etching, reactive ion etching, and laser ablation processes. It can be understood that the groove GTI divides the first conductive material 205' into multiple gates 205. Adjacent gates 205 in the first direction are spaced by the groove GIT.

In some embodiments, the groove GIT penetrates through both the first conductive material 205' and the first dielectric layer 201 in the third direction. The groove GIT divides both the first conductive material 205' and the first dielectric layer 201 in the first direction.

In some embodiments, the gate 205 surrounds the channel C. In practical applications, the gate oxide layer 204 is further formed between the gate 205 and the channel C, namely between the gate 205 and the second material layer 202.

Figure 3J:
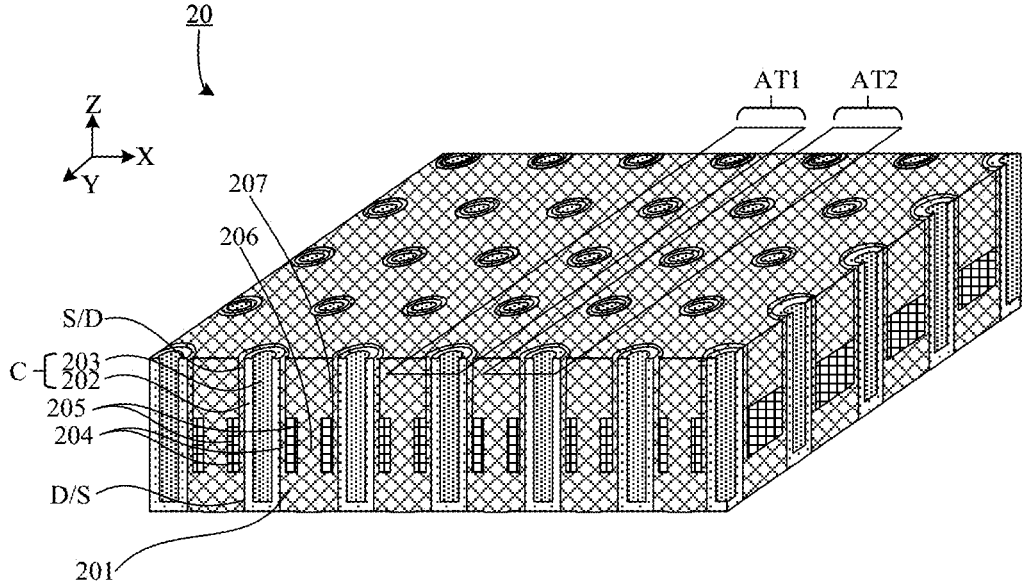
FIG. 3J is a tenth 3D structure diagram of a process for manufacturing a semiconductor structure according to some embodiments of the disclosure.

Referring to FIG. 3J, the groove GIT is filled with an insulating material to form a gate isolation structure 206. The insulating material may be deposited in the groove GIT by a PVD process, a CVD process, an ALD process, or the like. Chemical mechanical polishing (CMP) is performed on the insulating material so that a surface of the insulating material is flush with a surface of the second dielectric layer 207, thereby forming the gate isolation structure 206. Here, the insulating material includes, but not limited to, silicon nitride, silicon oxynitride, silicon carbide, silica, or the like.

In some embodiments, the semiconductor structure includes multiple transistors. Multiple channels C corresponding to the multiple transistors are arranged in an array in a first direction X and a second direction Y. Both the first direction X and the second direction Y are perpendicular to extension directions of the channels C.

A gate of transistor in each row AT along in the first direction is physically connected with each other. The gates of the transistors in each row AT1 are electrically isolated from the gates of the transistors in adjacent rows AT2 arranged in the first direction are electrically isolated from each other.

It can be understood that the method for manufacturing a transistor array in the embodiment of the disclosure is used for manufacturing, but not limited to, a specific number of transistors, and may also be a method for manufacturing a single transistor. The method for manufacturing a transistor array (in FIG. 1B) in the embodiment of the disclosure is understood with reference to the steps in FIGS. 3A to 3J, and will not be elaborated herein.

It is to be understood that, when a single transistor is manufactured with reference to the operations in FIGS. 3A to 3J, some operations may not be needed. For example, it is unnecessary to form the gate isolation structure 206 in FIGS. 3I and 3J. The method for manufacturing a single transistor (in FIG. 1A) in the embodiment of the disclosure is understood with reference to the operations in FIGS. 3A to 3H, and will not be elaborated herein.

Figure 4A:
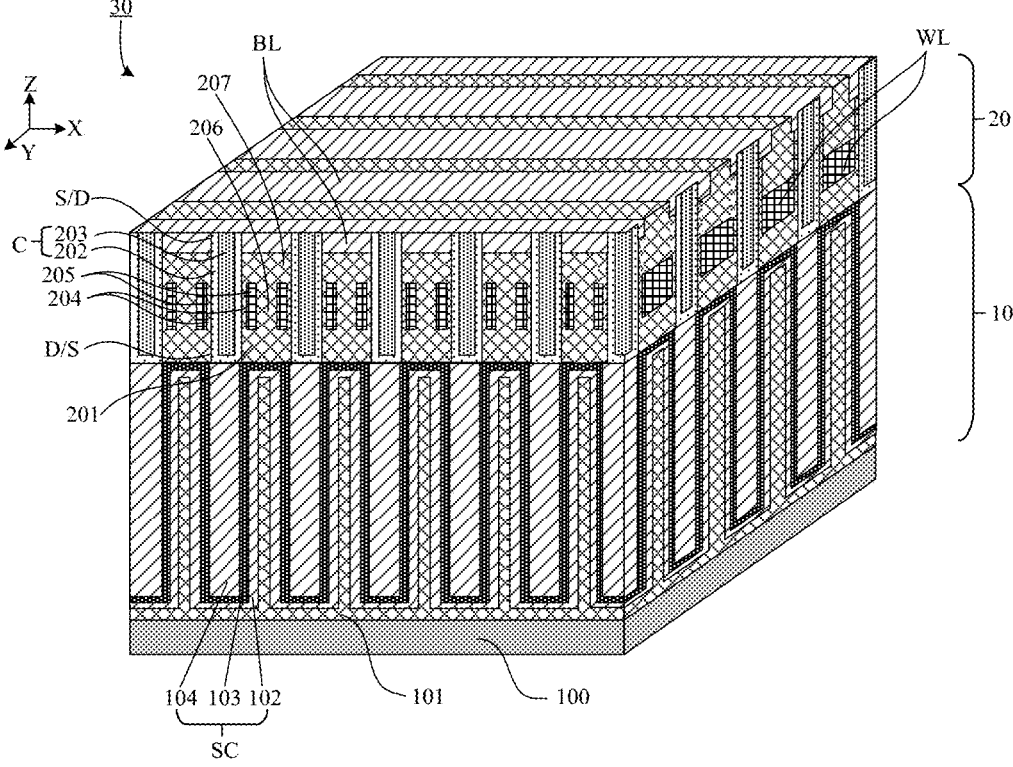
FIG. 4A is a 3D structure diagram of a memory according to some embodiments of the disclosure.

An embodiment of the disclosure provides a memory. FIG. 4A is a 3D structure diagram of a memory according to an embodiment of the disclosure.

Referring to FIG. 4A, in some embodiments, the memory 30 includes multiple first storage cells 10 arranged in an array in a first direction and a second direction, a first transistor array 20, and multiple first bit lines BL1.

The first transistor array 20 is located on the multiple first storage cells 10. The first transistor array 20 includes multiple transistors as described in the embodiment of the disclosure. The gates 205 of the transistors in each row along the first direction in the first transistor array 20 are physically connected with each other, the physically connected gates forming a first word line WL1. Each of the storage cells SC is connected with the source S or drain D of one transistor in the transistor array 20. Both the first direction and the second direction are perpendicular to extension direction of the channels C of the transistors.

The multiple first bit lines BL1 are arranged in parallel in the second direction and located on the first transistor array 20. Each of the first bit lines BL1 is connected with the drains D or sources S of the transistors in one of rows along the second direction in the first transistor array 20.

In practical applications, the first word line WL1 is connected with the gate 205 of each transistor in the transistor array 20. The first word line WL1 is configured to provide a word line voltage, and control a channel region in each transistor to be turned on or turned off through the word line voltage. The first bit line BL1 extending in the first direction X is connected with the drain D of each transistor in the transistor array 20. The first bit line BL1 is configured to perform a read or write operation on the storage cell 10 when each transistor is turned on.

In the embodiment of the disclosure, materials of the first word line WL1 and the first bit line BL1 include, but not limited to, tungsten, cobalt, molybdenum, copper, aluminum, polycrystalline silicon, doped silicon, silicide, or any combination thereof.

It can be understood that, in the memory, if each of the storage cells SC is connected with the source S of one transistor in the transistor array 20, each of the first bit lines BL1 is connected with the drains D of the transistors in one of rows along the second direction in the first transistor array 20. Alternatively, if each of the storage cells SC is connected with the drain of one transistor in the transistor array 20, each of the first bit lines BL1 is connected with the sources S of the transistors in one of rows along the second direction in the first transistor array 20.

In some embodiments, the memory provided in the embodiment of the disclosure includes various types of memories, such as NAND flash, Nor flash, DRAM, static random access memory (SRAM), phase-change memory (PCM), ferroelectric memory, magnetic random access memory, or a resistive random access memory.

In some embodiments, the memory includes the DRAM. The storage cell includes a capacitor SC. The capacitor SC includes a cylindrical second electrode 104, a dielectric layer 103 covering a sidewall and a bottom of the second electrode 104, and a first electrode 102 covering the dielectric layer 103. In practical applications, the second electrode 104 is connected with the source S of one transistor in the transistor array, the first electrode 102 is grounded, and the capacitor SC is configured to store written data.

In some embodiments, the memory includes a resistive random access memory. The storage cell includes an adjustable resistor. The adjustable resistor is connected between the first bit line BL1 and the source S of one transistor in the transistor array 20. Alternatively, the adjustable resistor is connected between the first bit line BL1 and the drain D of one transistor in the transistor array 20. The adjustable resistor is configured to adjust a state of stored data through a bit line voltage provided by the first bit line BL1.

In the embodiment of the disclosure, only some common memories are listed as examples. The scope of protection of the disclosure is not limited thereto. Any memory including the transistor provided in the embodiment of the disclosure shall fall within the scope of protection of the disclosure.

In practical applications, in order to improve the integration level of the memory, the memory may include multiple layers of stacked storage cells, such as two layers of storage cells stacked in a third direction.

Figure 4B:
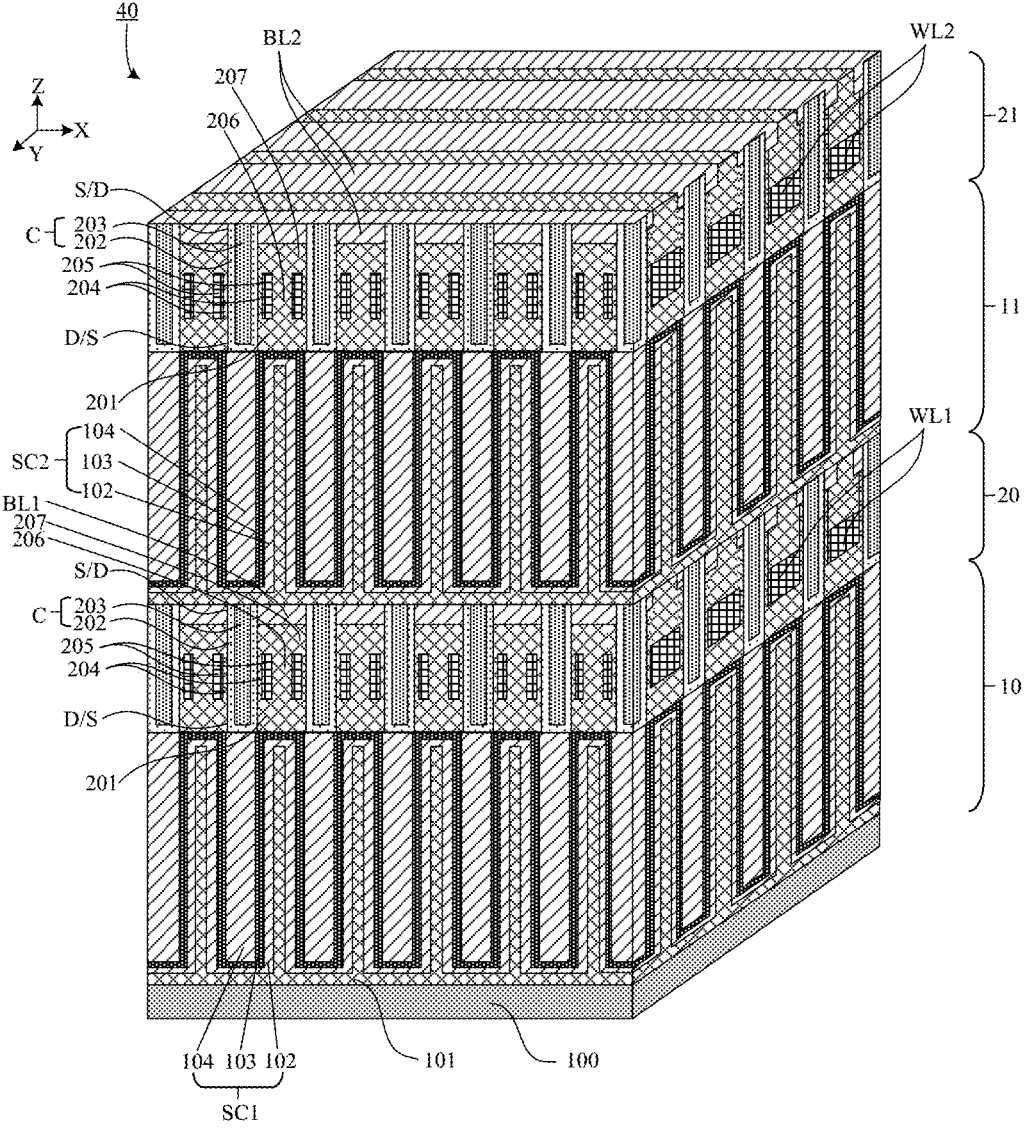
FIG. 4B is a 3D structure diagram of another memory according to some embodiments of the disclosure.

In some embodiments, as shown in FIG. 4B, the memory further includes multiple second storage cells 11, a second transistor array 21, and multiple second bit lines BL2.

The multiple second storage cells 11 are located on the first bit lines BL1 and arranged in an array in the first direction and the second direction.

The second transistor array 21 is located on the multiple second storage cells 11. The second transistor array 21 includes transistors provided in the embodiment of the disclosure. The gates 205 of the transistors in each row along the first direction in the second transistor array 21 are physical connected with each other, the physically connected gates forming a second word line WL2. Each of the second storage cells SC2 is connected with the source S or drain D of one transistor in the second transistor array 21.

The multiple second bit lines BL2 are located on the second transistor array 21. The multiple second bit lines BL2 are arranged in parallel in the second direction. Each of the second bit lines BL2 is connected with the drains D or sources S of the transistors in one of rows arranged in the second direction in the second transistor array 21.

In each embodiment of the disclosure, the transistor may be manufactured at a relatively low temperature, and thus is compatible with a back-end process. Therefore, a periphery of the memory may be moved to be below the storage cell array, which reduces the space occupation of a memory chip greatly. In addition, the route of stacking single DRAM elements is created in the back-end process, thereby achieving a 3D-DRAM architecture. The DRAM provided in the embodiment of the disclosure may play a key role in applications with strict requirements, such as cloud computing and artificial intelligence.

A method for manufacturing a memory in an embodiment of the disclosure will be described below in detail in combination with FIG. 5 and FIGS. 6A to 6G FIG. 5 is an implementation flowchart of a method for manufacturing a semiconductor structure according to an embodiment of the disclosure. FIGS. 6A to 6G are 3D structure diagrams of a process for manufacturing a memory according to an embodiment of the disclosure.

Referring to FIG. 5, in some embodiments, the method includes the following operations.

In 5001, multiple first storage cells 10 are formed, in which the multiple first storage cells 10 are arranged in an array in a first direction and a second direction.

In 5002, a first transistor array 20 is formed on the multiple first storage cells 10, in which the first transistor array 20 is manufactured by the method for manufacturing a transistor in the embodiment of the disclosure, gates 205 of transistors in each row along the first direction in the first transistor array 20 are physical connected with each other, the physically connected gates 205 forming a first word line WL1, and each of the first storage cells 10 is connected with a source S or drain D of one transistor in the first transistor array 20, both the first direction and the second direction are perpendicular to extension direction of channels C of the transistors.

In 5003, multiple first bit lines BL1 arranged in parallel in the second direction are formed on the first transistor array 20, in which each of the first bit lines BL1 is connected with the drains D or sources S of the transistors in one of rows in the second direction in the transistor array 20.

5001 is performed to form multiple first storage cells 10. The multiple first storage cells 10 are arranged in an array in a first direction and a second direction. References are made to FIGS. 6A to 6D which are 3D structure diagrams of a process for manufacturing a capacitor (which may be understood as a storage cell) according to an embodiment of the disclosure.

Figure 6A:
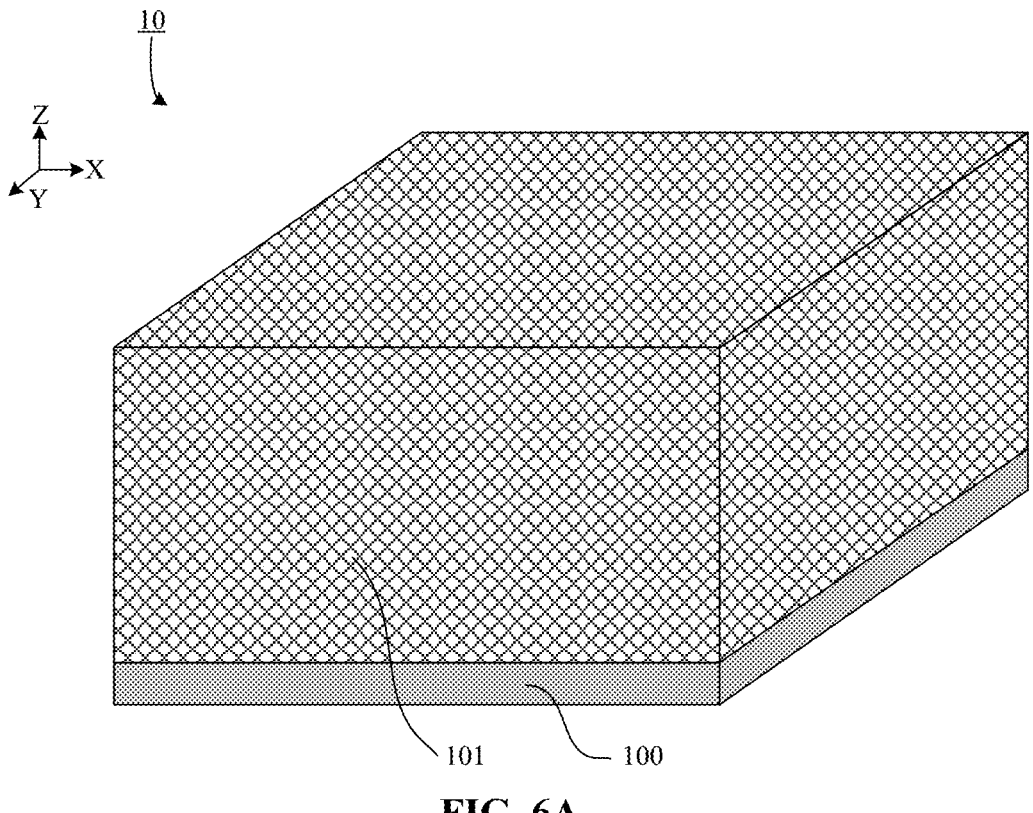
FIG. 6A is a first 3D structure diagram of a process for manufacturing a memory according to some embodiments of the disclosure.
Figure 6B:
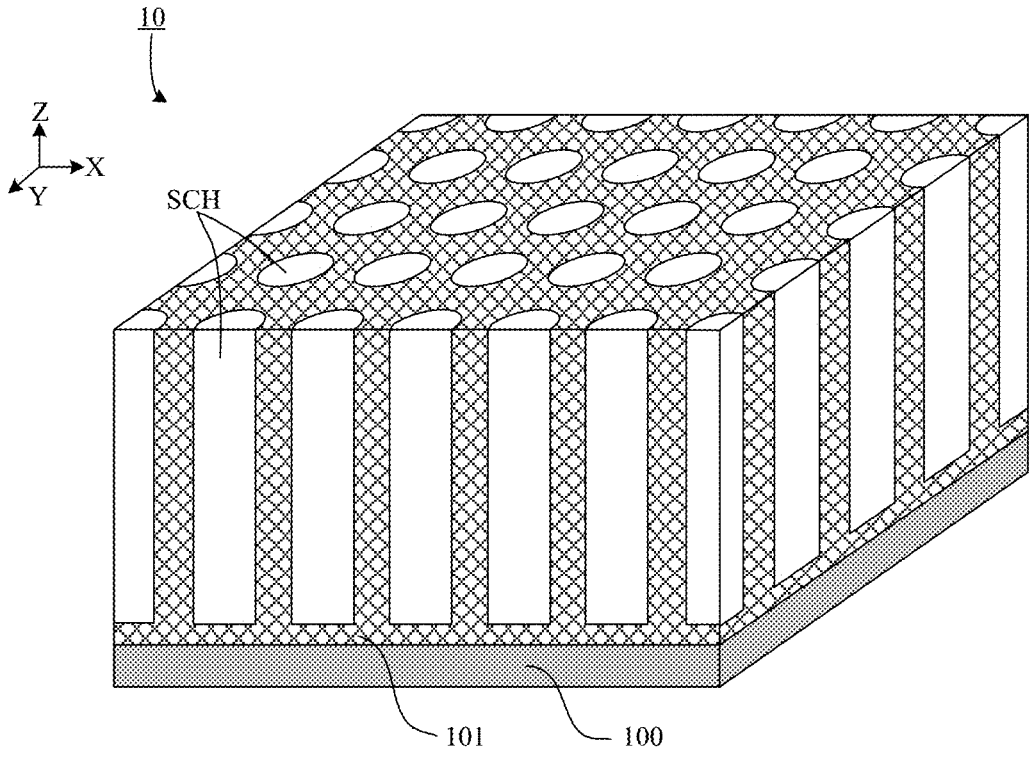
FIG. 6B is a second 3D structure diagram of a process for manufacturing a memory according to some embodiments of the disclosure.
Figure 6C:
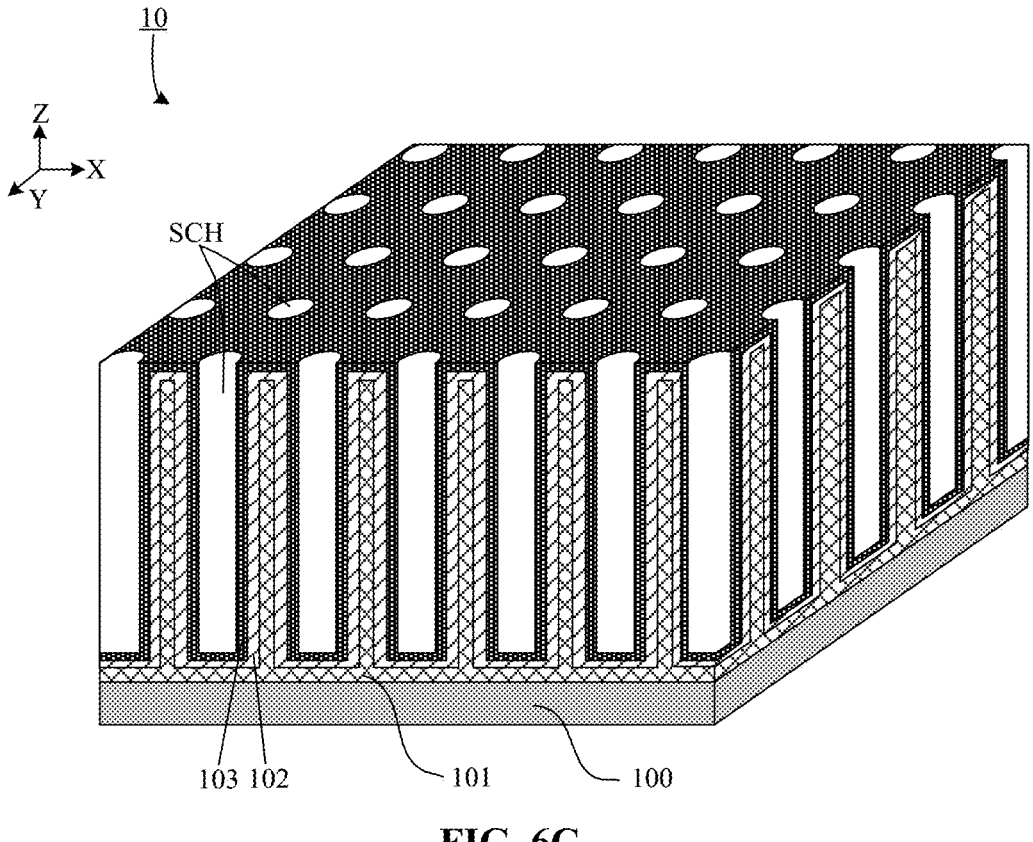
FIG. 6C is a third 3D structure diagram of a process for manufacturing a memory according to some embodiments of the disclosure.
Figure 6D:
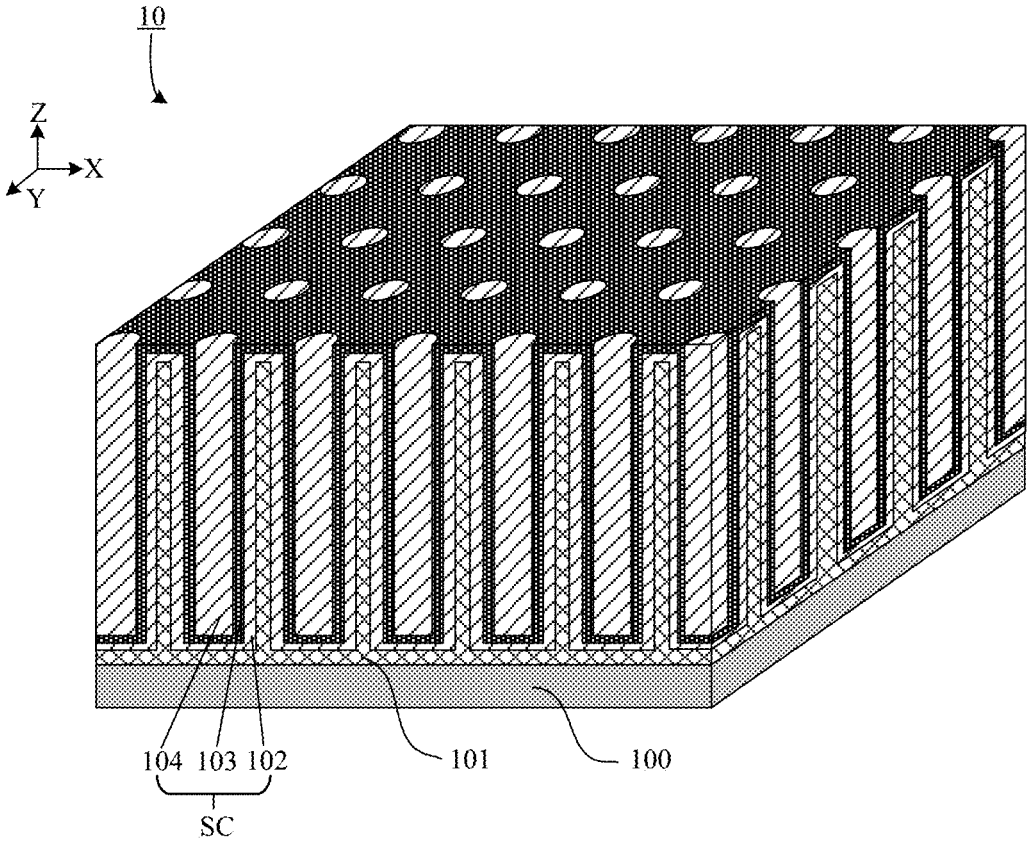
FIG. 6D is a fourth 3D structure diagram of a process for manufacturing a memory according to some embodiments of the disclosure.

In some embodiments, referring to FIG. 6D, the first storage cell includes a capacitor SC.

Forming multiple first storage cells 10 includes the following operations.

A third dielectric layer 101 is provided.

Multiple second holes SCH arranged in an array in the first direction and the second direction are formed in the third dielectric layer 101.

A first electrode 102 is formed at sidewalls and bottoms of the second holes SCH and a top surface of the third dielectric layer 101.

A dielectric layer 103 is formed on the first electrode 102.

The formed second holes SCH with the first electrode 102 and the dielectric 103 are filled to form multiple second electrodes 104, in which each of the second electrodes 104 is connected with the source or drain of one transistor in the transistor array.

Referring to FIG. 6A, a third dielectric layer 101 is provided. A material of the third dielectric layer 101 may include, but not limited to, silicon oxide. In practical applications, the third dielectric layer 101 may be formed by a PVD process, a CVD process, an ALD process, etc.

In some embodiments, whether to form the third dielectric layer 101 on a substrate 100 may be determined as practically required by a device. A material of the substrate 100 may refer to the material of the above-mentioned substrate.

Referring to FIG. 6B, multiple second holes SCH arranged in an array in the first direction and the second direction are formed in the third dielectric layer 101. The second holes SCH penetrating through the third dielectric layer 101 may be formed by an etching process. In practical applications, the second holes SCH may be formed in the third dielectric layer 101 by dry etching, such as ion beam milling etching, plasma etching, reactive ion etching, and laser ablation processes.

Referring to FIG. 6C, a first electrode 102 is formed at sidewalls and bottoms of the second holes SCH and a top surface of the third dielectric layer 101. A dielectric layer 103 is formed on the first electrode 102. The first electrode 102 and the dielectric 103 may be formed sequentially by one or more deposition processes. The process includes, but not limited to, a PVD process, a CVD process, an ALD process, or any combination thereof. For example, the first electrode 102 and the dielectric layer 103 may be formed by the ALD process.

In practical applications, a material of the first electrode 102 may be a metallic material or a semiconductor conductive material, such as copper, cobalt, tungsten, doped silicon, polycrystalline silicon, or any combination thereof.

Here, a material of the dielectric 103 may be a dielectric material with a dielectric constant greater than $SiO_2$ (k~3.9). In practical applications, the material of the dielectric 103 may include $Ta_2O_5$ (k~26), $TiO_2$ (k~80), $ZrO_2$ (k~25), $Al_2O_3$ (k~9), $HfSiO_x$ (k~4 to 25), and $HfO_2$ (k~25).

Referring to FIG. 6D, the formed second holes SCH with the first electrode 102 and the dielectric 103 are filled to form multiple second electrodes 104. A second electrode material may be deposited in the formed second holes SCH with the first electrode 102 and the dielectric 103 by one or more deposition processes. CMP process treatment is performed on the second electrode material to make a surface of the second electrode material flush with a surface of the dielectric layer 103, thereby forming the second electrodes 104. The process includes, but not limited to, a PVD process, a CVD process, an ALD process, or any combination thereof. For example, the second electrodes 104 may be formed by the ALD process. In practical applications, the material of the second electrode may be a metallic material or a semiconductor conductive material, such as copper, cobalt, tungsten, molybdenum, doped silicon, polycrystalline silicon, or any combination thereof.

The capacitor (which may be understood as the capacitor SC in the first storage cell) includes the first electrode 102, the dielectric layer 103, and second electrode 104 formed in each second hole SCH.

In practical applications, the second electrode 104 of the capacitor is connected with the source S of one transistor in the transistor array, the first electrode 102 of the capacitor is grounded, and the capacitor is configured to store written data.

Figure 6E:
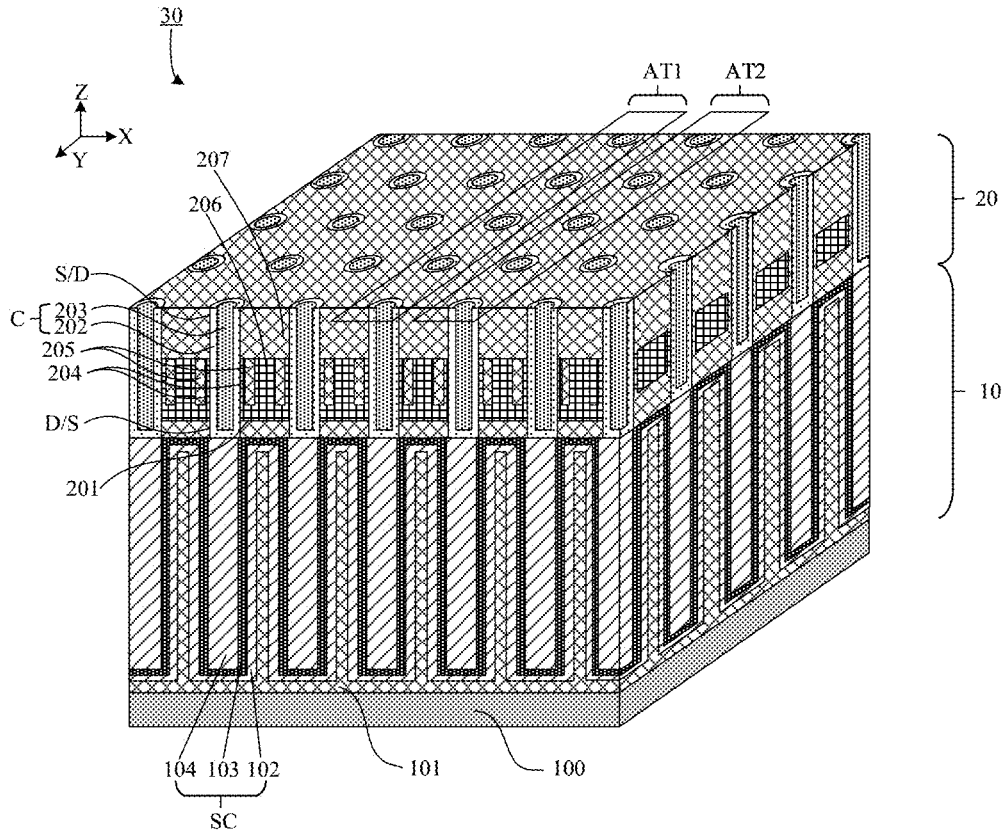
FIG. 6E is a fifth 3D structure diagram of a process for manufacturing a memory according to some embodiments of the disclosure.

The operation 5002 is performed, referring to FIG. 6E, so as to form a first transistor array 20 on the multiple first storage cells 10. The first transistor array 20 is manufactured by the method for manufacturing a transistor in the embodiment of the disclosure. Gates 205 of transistors in each row of the transistors along the first direction in transistor array 20 are physically connected with each other, the physically connected gates 205 forming a first word line WL1. Each of the first storage cells 10 is connected with a source S or drain D of one transistor in the first transistor array 20. Both the first direction and the second direction are perpendicular to extension direction of channels C of the transistors.

It is to be noted that, in FIGS. 3F to 3J and FIGS. 1A to 1B, the gate oxide layer 204 in the first transistor array 20 is shown. For ease of description, in FIGS. 6E to 6G and FIGS. 4A to 4B, only the gate oxide layer 204 between the gate and the channel in the first transistor array 20 (and/or the second transistor array 21) is shown without distinguishing, by color filling, from the first dielectric layer 201, the gate isolation structure 206, and the second dielectric layer 207. In practical applications, materials of the gate oxide layer 204, the first dielectric layer 201, the gate isolation structure 206, and the second dielectric layer 207 are all insulating materials that may be the same or different.

The operation 5003 is performed to form, on the first transistor array 20, multiple first bit lines BL1 arranged in parallel in the second direction. Each of the first bit lines BL1 is connected with the drains D or sources S of the transistors in one of rows along the second direction in the transistor array 20.

Figure 6F:
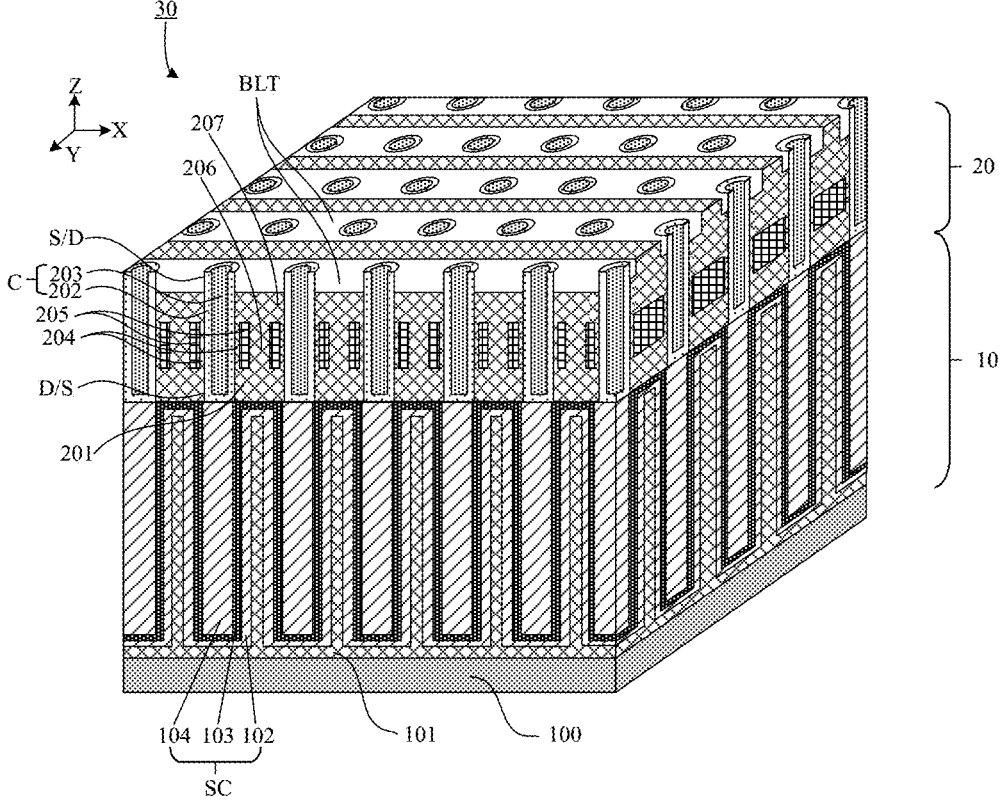
FIG. 6F is a sixth 3D structure diagram of a process for manufacturing a memory according to some embodiments of the disclosure.
Figure 6G:
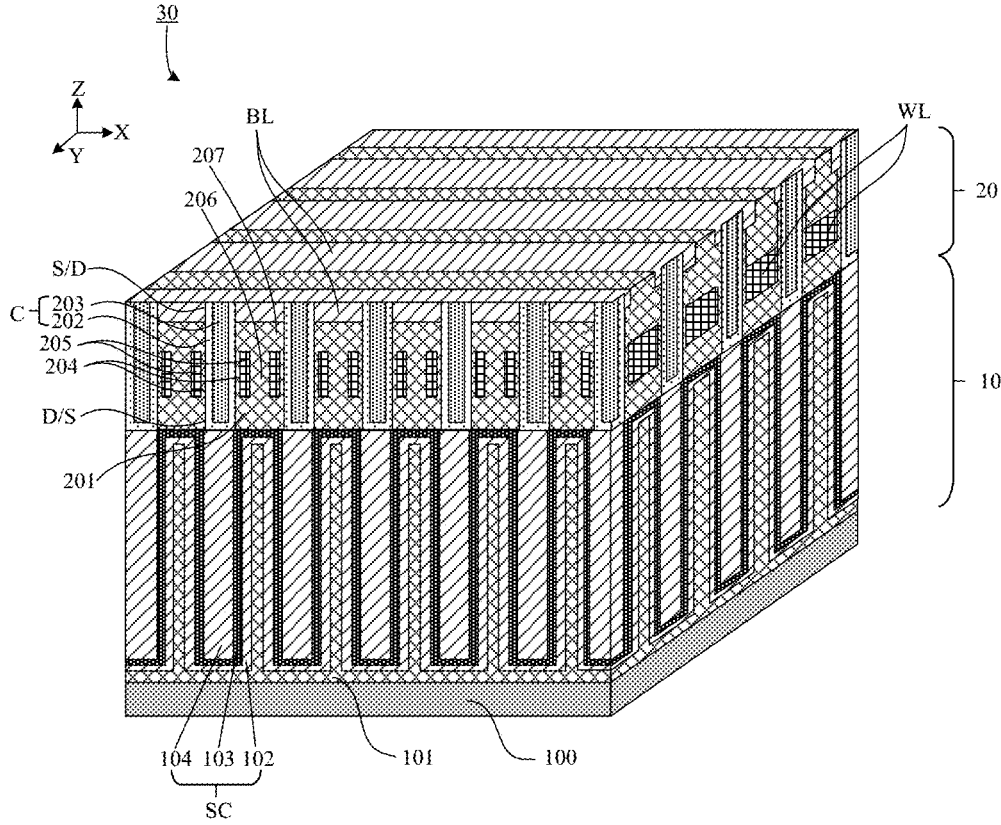
FIG. 6G is a seventh 3D structure diagram of a process for manufacturing a memory according to some embodiments of the disclosure.

In some embodiments, as shown in FIGS. 6F and 6G, forming first bit lines BL1 arranged in parallel in second direction includes the following operations.

A second dielectric layer 207 covering the gates 205 is formed.

The second dielectric layer 207 is etched partially to form multiple second trenches BLT extending in the second direction, in which the second trenches BLT expose sidewalls of the channels C partially.

The second trenches BLT are filled with a second conductive material to form the first bit lines BL1 surrounding end portions of the channels C.

In some embodiments, part of the second dielectric layer 207 and part of the gate isolation structure 206 may be removed by an etching process to form multiple second trenches BLT extending in the second direction. The second trenches BLT expose sidewalls of the channels C partially. In practical applications, the second trench BLT exposing the sidewall of the channel C may be formed by dry etching, such as ion beam milling etching, plasma etching, reactive ion etching, and laser ablation processes.

In some embodiments, a depth of the groove GT in the third direction is less than ½ of a thickness of the channel C in the third direction. In practical applications, the depth of the groove GT in the third direction should be equivalent to a diffusion depth of the source S or the drain D in the channel C in the third direction.

In practical applications, the second conductive material may be deposited in the second trenches BLT by a PVD process, a CVD process, an ALD process, or the like. CMP process treatment is performed on the second conductive material to make the surface of the second conductive material flush with the surface of the second dielectric layer, thereby forming the first bit lines BL1 surrounding end portions of the channels C. In the embodiment of the disclosure, the second conductive material may be a metallic material or a semiconductor conductive material, such as copper, cobalt, tungsten, molybdenum, doped silicon, polycrystalline silicon, or any combination thereof.

In some embodiments, referring to FIG. B, another method for manufacturing a memory in the embodiment of the disclosure further includes the following operations.

Multiple second storage cells 11 are formed on the first bit lines BL1, in which the multiple second storage cells 11 are arranged in an array in the first direction and the second direction.

A second transistor array 21 is formed on the multiple second storage cells 11, in which the second transistor array 21 is manufactured by the method for manufacturing a transistor in the embodiment of the disclosure, where gates 205 of transistors in each row along the first direction in the second transistor array 21 are physically connected with each other, the physically connected gates forming a second word line WL2, and each of the second storage cells SC2 is connected with a source S or drain D of one transistor in the second transistor array 21.

Multiple second bit lines BL2 arranged in parallel in the second direction are formed on the second transistor array 21, in which each of the second bit lines BL2 is connected with the drains D or sources S of the transistors in one of rows arranged in the second direction in second transistor array 21.

It is to be noted that the memory shown in FIG. 4B may be understood as being formed by the 3D stacking of two structures shown in FIG. 6G in the third direction. The method for manufacturing a memory in the embodiment of the disclosure is not limited to the 3D stacking of a certain specific number, and may also be used for forming a memory by the 3D stacking of two or more than two structures shown in FIG. 6G in the third direction.

Similar to the memory in the above-mentioned embodiment, technical features that are not disclosed in detail in the method for manufacturing a memory in the embodiment of the disclosure are understood with reference to the above-mentioned embodiment, and will not be elaborated herein.

It is to be understood that "one embodiment" or "an embodiment" mentioned throughout the specification means that specific features, structures, or characteristics related to the embodiment are included in at least one embodiment of the disclosure. Therefore, "in one embodiment" or "in an embodiment" mentioned throughout the specification does not always refer to the same embodiment. In addition, these specific features, structures, or characteristics may be combined in one or more embodiments in any appropriate way. It is to be understood that, in each embodiment of the disclosure, the magnitude of the sequence number of each process does not mean an execution sequence, and the execution sequence of each process is determined by its function and an internal logic, and does not form any limit to an implementation process of the embodiments of the disclosure. The sequence numbers of the embodiments of the disclosure are only for description and do not represent superiority-inferiority of the embodiments.

The methods disclosed in some method embodiments provided in the disclosure may be combined freely without conflicts, thereby obtaining new method embodiments.

The above is only the specific implementation mode of the disclosure and not intended to limit the scope of protection of the disclosure. Any variations or replacements apparent to those skilled in the art within the technical scope disclosed in the disclosure shall fall within the scope of protection of the disclosure. Therefore, the scope of protection of the disclosure shall be subject to the scope of protection of the claims.

In the embodiments of the disclosure, the channel including the first material layer and the second material layer enable the transistor to have both relatively high field-effect mobility and a relatively high threshold voltage, so that a requirement for high performance of the transistor can be met.

What is claimed is:

1. A method for manufacturing a semiconductor structure comprising at least one transistor, wherein the method comprises a method for manufacturing the transistor, the method for manufacturing the transistor comprises:

forming a channel, wherein the channel comprises a first material layer and a second material layer surrounding the first material layer, a resistivity of the first material layer is greater than a first preset value, a resistivity of the second material layer is less than a second preset value, and the first preset value is greater than the second preset value;

forming a gate of the transistor covering at least one side surface of the channel; and forming a source and a drain of the transistor at two ends of an extension direction of the channel, respectively;

wherein forming the channel comprises:

providing a first dielectric layer;

forming a first hole in the first dielectric layer;

forming the second material layer at a sidewall and a bottom of the first hole; and filling the first hole with the second material layer to form the first material layer;

wherein forming the second material layer at the sidewall and the bottom of the first hole comprises:

forming the second material layer in an oxygen-free atmosphere by an atomic layer deposition process; and filling the first hole with the second material layer to form the first material layer comprises:

forming the first material layer in an oxygen-containing atmosphere by in-situ deposition.

2. The method of claim 1, wherein the semiconductor structure comprises a plurality of transistors; a plurality of the channels corresponding to the plurality of transistors are arranged in an array in a first direction and a second direction, both the first direction and the second direction are perpendicular to the extension direction of the channels;

wherein the gates of the transistors in each row along the first direction are physically connected with each other; and the gates of the transistors in each row along the first direction are electrically isolated from the gates of the transistors in an adjacent row along the first direction.

3. The method of claim 1, wherein at least one of a material of the first material layer and a material of the second material layer comprise at least one of indium oxide, gallium oxide, zinc oxide, indium gallium oxide, indium zinc oxide, gallium zinc oxide or indium gallium zinc oxide.

4. The method of claim 1, wherein after forming the first material layer, the method further comprises:

etching the first dielectric layer partially to expose the second material layer;

forming a gate oxide layer on the exposed second material layer; and filling sequentially with a first conductive material and a second dielectric layer, etching the first conductive material and the second dielectric layer to form a groove, and filling the groove with an insulating material to form a gate isolation structure.

5. A method for manufacturing a memory, comprising:

forming a plurality of first storage cells, wherein the plurality of first storage cells are arranged in an array in a first direction and a second direction;

forming a first transistor array on the plurality of first storage cells, wherein a transistor in the first transistor array is manufactured by a method for manufacturing a transistor, the method for manufacturing a transistor comprises: forming a channel, wherein the channel comprises a first material layer and a second material layer surrounding the first material layer, a resistivity of the first material layer is greater than a first preset value, a resistivity of the second material layer is less than a second preset value, and the first preset value is greater than the second preset value; forming a gate of the transistor covering at least one side surface of the channel; and forming a source and a drain of the transistor at two ends of an extension direction of the channel, respectively; wherein, gates of the transistors in each row along the first direction in the first transistor array are physical connected with each other, the physically connected gates forming a first word line, and each of the first storage cells is connected with a source or drain of one transistor in the first transistor array, and both the first direction and the second direction are perpendicular to the extension direction of the channels of the transistors; and forming, on the first transistor array, a plurality of first bit lines arranged in parallel in the second direction, wherein each of the first bit lines is connected with drains or sources of the transistors in one of rows arranged along the second direction in the transistor array;

wherein forming the channel comprises;

providing a first dielectric layer;

forming a first hole in the first dielectric layer;

forming the second material layer at a sidewall and a bottom of the first hole; and filling the first hole with the second material layer to form the first material layer;

wherein forming the second material layer at the sidewall and the bottom of the first hole comprises:

forming the second material layer in an oxygen-free atmosphere by an atomic layer deposition process; and filling the first hole with the second material layer to form the first material layer comprises:

forming the first material layer in an oxygen-containing atmosphere by in-situ deposition.

6. The method of claim 5, wherein forming the plurality of first bit lines arranged in parallel in the second direction comprises:

forming a second dielectric layer covering the gates;

etching the second dielectric layer partially to form a plurality of second trenches extending in the second direction, in which the second trenches expose sidewalls of the channels partially; and filling the second trenches with a second conductive material to form the first bit lines surrounding end portions of the channels.

7. The method of claim 5, wherein the first storage cell comprises a capacitor; and forming the plurality of first storage cells comprises:

providing a third dielectric layer, forming, in the third dielectric layer, a plurality of second holes arranged in an array in the first direction and the second direction, forming a first electrode at sidewalls and bottoms of the second holes and a top surface of the third dielectric layer, forming a dielectric layer on the first electrode, and filling the second holes with the first electrode and the dielectric layer to form a plurality of second electrodes, wherein each of the second electrodes is connected with a source or a drain of one transistor in the transistor array.

8. The method of claim 5, comprising:

forming a plurality of second storage cells on the first bit lines, wherein the plurality of second storage cells are arranged in an array in the first direction and the second direction;

forming a second transistor array on the plurality of second storage cells, wherein a transistor in the second transistor array is manufactured by the method of manufacturing a transistor, gates of transistors in each row along the first direction in the second transistor array are physical connected with each other, the physically connected gates forming a second word line, and each of the second storage cells is connected with a source or drain of one transistor in the second transistor array; and forming, on the second transistor array, a plurality of second bit lines arranged in parallel in the second direction, wherein each of the second bit lines is connected with drains or sources of the transistors in one of rows arranged along the second direction in the second transistor array.

9. A method for manufacturing a semiconductor structure comprising at least one transistor, wherein the method comprises a method for manufacturing the transistor, the method for manufacturing the transistor comprises:

forming a channel, wherein the channel comprises a first material layer and a second material layer surrounding the first material layer, a resistivity of the first material layer is greater than a first preset value, a resistivity of the second material layer is less than a second preset value, and the first preset value is greater than the second preset value;

forming a gate of the transistor covering at least one side surface of the channel; and forming a source and a drain of the transistor at two ends of an extension direction of the channel, respectively;

wherein forming the channel comprises:

providing a first dielectric layer;

forming a first hole in the first dielectric layer;

forming the second material layer at a sidewall and a bottom of the first hole; and filling the first hole with the second material layer to form the first material layer;

wherein after forming the first material layer, the method further comprises:

etching the first dielectric layer partially to expose the second material layer;

forming a gate oxide layer on the exposed second material layer; and filling sequentially with a first conductive material and a second dielectric layer, etching the first conductive material and the second dielectric layer to form a groove, and filling the groove with an insulating material to form a gate isolation structure.

10. The method of claim 9, wherein the semiconductor structure comprises a plurality of transistors; a plurality of the channels corresponding to the plurality of transistors are arranged in an array in a first direction and a second direction, both the first direction and the second direction are perpendicular to the extension direction of the channels;

wherein the gates of the transistors in each row along the first direction are physically connected with each other; and the gates of the transistors in each row along the first direction are electrically isolated from the gates of the transistors in an adjacent row along the first direction.

11. The method of claim 9, wherein at least one of a material of the first material layer and a material of the second material layer comprise at least one of indium oxide, gallium oxide, zinc oxide, indium gallium oxide, indium zinc oxide, gallium zinc oxide or indium gallium zinc oxide.

* * * * *